(12) United States Patent
Yeh

(10) Patent No.: US 7,170,785 B2
(45) Date of Patent: Jan. 30, 2007

(54) METHOD AND APPARATUS FOR OPERATING A STRING OF CHARGE TRAPPING MEMORY CELLS

(75) Inventor: Chih Chieh Yeh, Taipei (TW)

(73) Assignee: Macronix International Co., Ltd., Hsinchu (TW)

( * ) Notice: Subject to any disclaimer, the term of this patent is extended or adjusted under 35 U.S.C. 154(b) by 64 days.

(21) Appl. No.: 10/973,176

(22) Filed: Oct. 26, 2004

(65) Prior Publication Data

US 2006/0049448 A1 Mar. 9, 2006

Related U.S. Application Data

(60) Provisional application No. 60/608,455, filed on Sep. 9, 2004, provisional application No. 60/608,528, filed on Sep. 9, 2004.

(51) Int. Cl.
*G11C 16/04* (2006.01)
*G11C 16/06* (2006.01)

(52) U.S. Cl. .................... 365/185.17; 365/185.03; 365/185.23; 365/185.26; 365/185.27

(58) Field of Classification Search ........... 365/185.17, 365/185.26
See application file for complete search history.

(56) References Cited

U.S. PATENT DOCUMENTS

| | | | |
|---|---|---|---|
| 4,939,690 A | 7/1990 | Momodomi et al. | |
| 5,365,083 A | 11/1994 | Tada | |
| 5,483,484 A * | 1/1996 | Endoh et al. ......... | 365/185.18 |
| 5,768,192 A | 6/1998 | Eitan | |
| 5,814,853 A | 9/1998 | Chen | |
| 6,011,725 A | 1/2000 | Eitan | |
| 6,160,286 A | 12/2000 | Chi | |
| 6,436,769 B1 | 8/2002 | Kanamori | |
| 6,510,082 B1 | 1/2003 | Le et al. | |
| 6,639,836 B1 | 10/2003 | Hung et al. | |
| 6,646,914 B1 * | 11/2003 | Haddad et al. ......... | 365/185.05 |
| 6,657,894 B2 | 12/2003 | Yeh et al. | |
| 6,670,240 B2 | 12/2003 | Ogura et al. | |
| 6,690,601 B2 | 2/2004 | Yeh et al. | |
| 6,771,543 B2 | 8/2004 | Wong et al. | |
| 6,808,986 B2 | 10/2004 | Rao et al. | |
| 6,826,080 B2 | 11/2004 | Park et al. | |
| 6,873,004 B1 | 3/2005 | Han et al. | |
| 2002/0167844 A1 | 11/2002 | Han et al. | |
| 2003/0032243 A1 | 2/2003 | Ogura et al. | |

OTHER PUBLICATIONS

U.S. Appl. No. 10/855,286, filed May 26, 2004, entitled "NAND-Type Non-Volatile Memory Cell and Method for Operating Same," 51 pages.

Yeh, C.C., et al., "PHINES: A Novel Low Power Program/Erase, Small Pitch, 2-Bit per Cell Flash Memory," Electron Devices Meeting, 2002. IEDM '02. Digest. International, Dec. 8-11, 2002, pp. 931-934.

* cited by examiner

*Primary Examiner*—Amir Zarabian
*Assistant Examiner*—Ly Duy Pham
(74) *Attorney, Agent, or Firm*—Kenta Suzue; Haynes Beffel & Wolfeld LLP

(57) ABSTRACT

A string of memory cells with a charge trapping structure is read, by selecting part of a memory cell selected by a word line. Part of the memory cell is selected by turning on one of the pass transistors on either side of the string of memory cells. The charge storage state of the selected part is determined by measuring current in a bit line tied to both pass transistors.

36 Claims, 17 Drawing Sheets

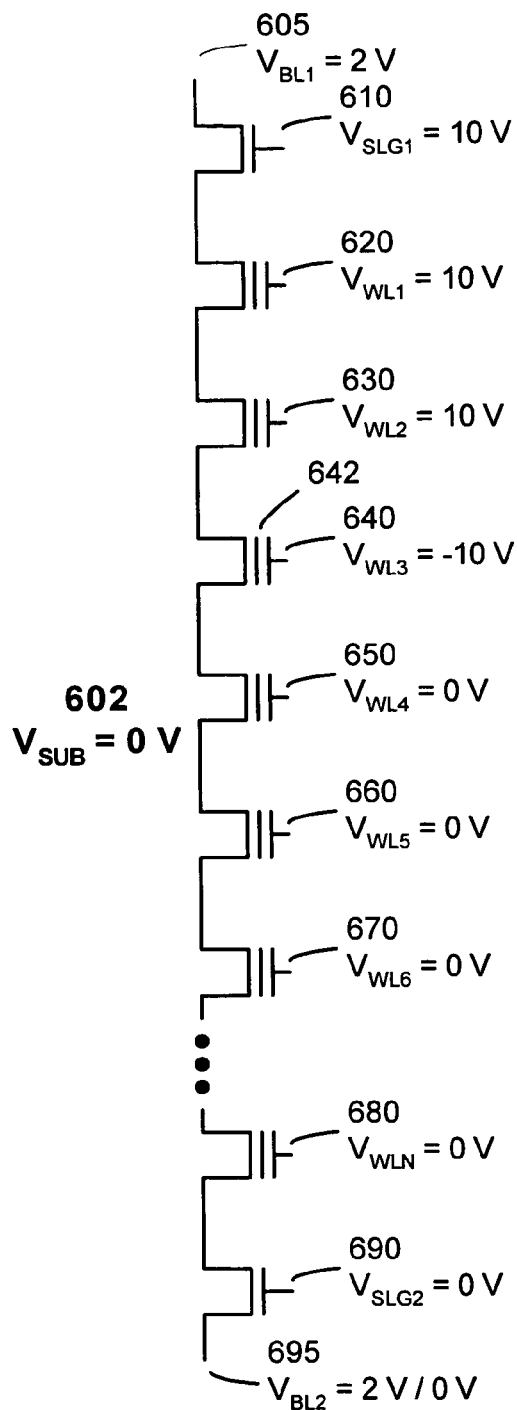
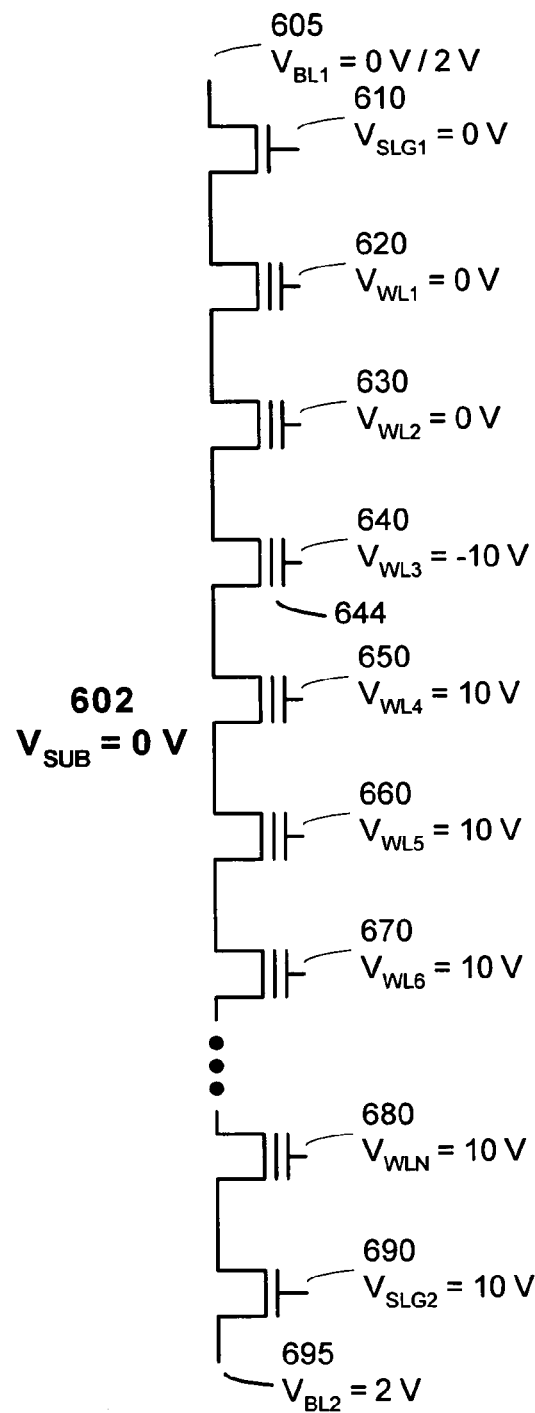
Fig. 6A                    Fig. 6B

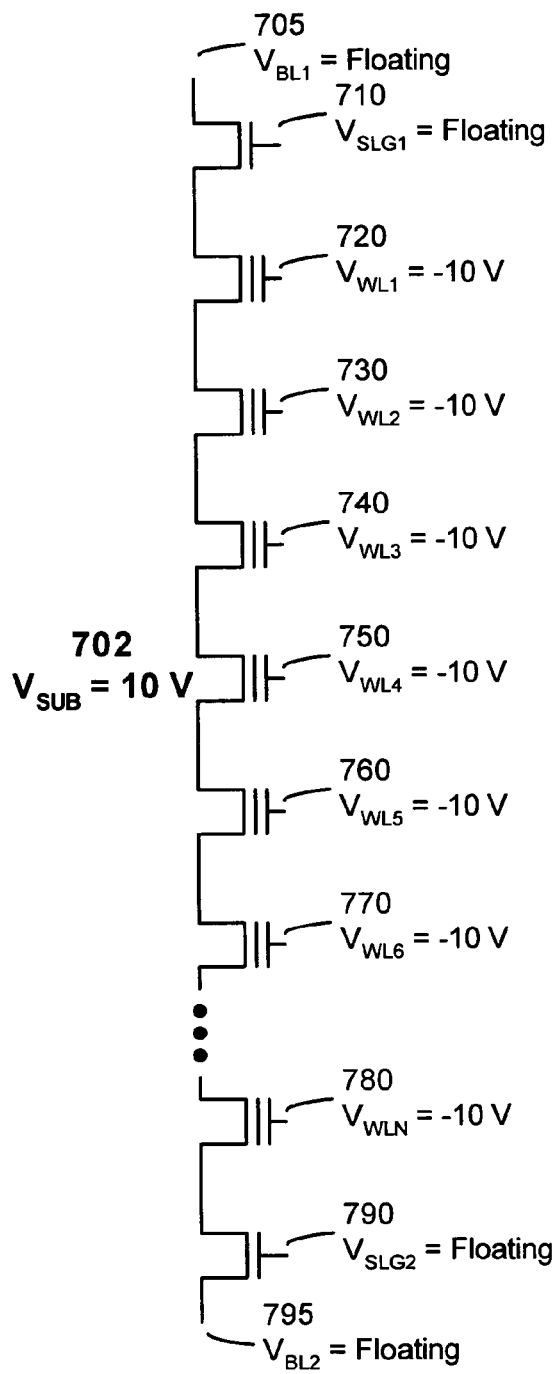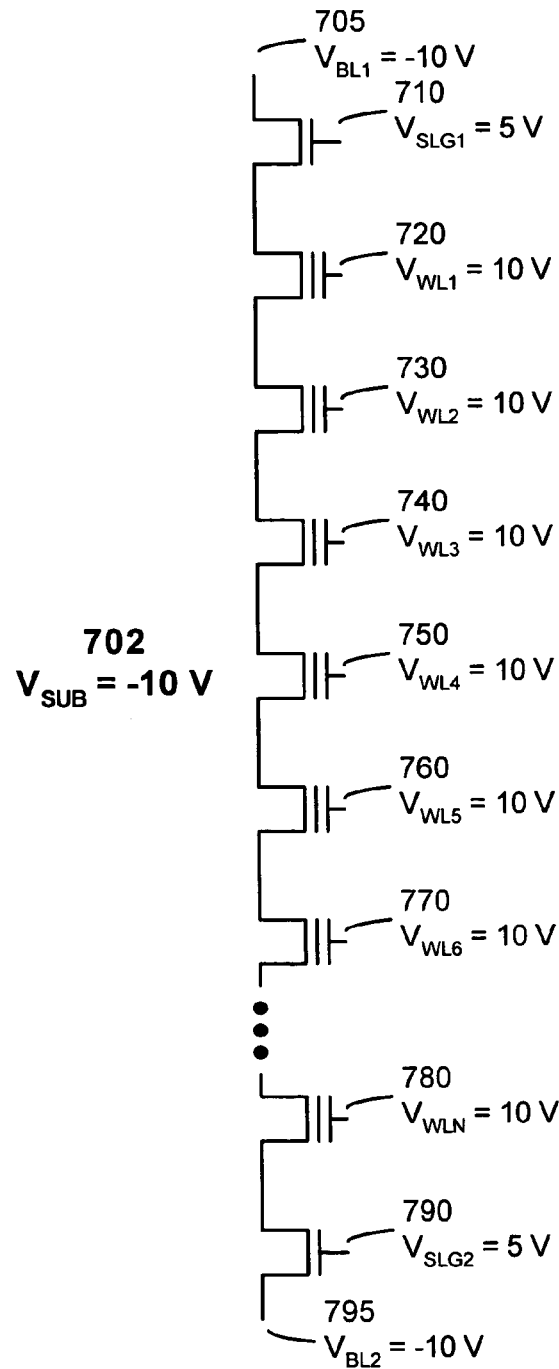
Fig. 7A                    Fig. 7B

METHOD AND APPARATUS FOR OPERATING A STRING OF CHARGE TRAPPING MEMORY CELLS

RELATED APPLICATIONS

The present application claims priority to U.S. Provisional Application 60/608,455 filed 9 Sep. 2004. The present application also claims priority to U.S. Provisional Application No. 60/608,528 filed 9 Sep. 2004.

BACKGROUND OF THE INVENTION

1. Field of the Invention

The present invention relates to electrically programmable and erasable non-volatile memory, and more particularly to charge trapping memory with a bias arrangement that reads the contents of different positions in the charge trapping structure of the memory cell with great sensitivity.

2. Description of Related Art

Electrically programmable and erasable non-volatile memory technologies based on charge storage structures known as EEPROM and flash memory are used in a variety of modern applications. A number of memory cell structures are used for EEPROM and flash memory. As the dimensions of integrated circuits shrink, greater interest is arising for memory cell structures based on charge trapping dielectric layers, because of the scalability and simplicity of the manufacturing processes. Memory cell structures based on charge trapping dielectric layers include structures known by the industry name PHINES, for example. These memory cell structures store data by trapping charge in a charge trapping dielectric layer, such as silicon nitride. As negative charge is trapped, the threshold voltage of the memory cell increases. The threshold voltage of the memory cell is reduced by removing negative charge from the charge trapping layer.

Conventional memory cell structures rely on the reverse read operation to determine the contents of the memory structure. However, the reverse read technique effectively couples together multiple locations of the charge trapping structure, even when only portion of the charge trapping structure contains data of interest. This dependence constrains the difficulty of using the charge trapping structure as nonvolatile memory, by narrowing the sensing window of currents measured from the reverse read technique. Less data are stored in the charge trapping structure than otherwise possible.

Thus, a need exists for a charge trapping memory cell that can be read without suffering substantial coupling between multiple locations of the charge trapping structure, even when only a portion of the charge trapping structure contains data of interest.

SUMMARY OF THE INVENTION

A method of operating a memory cell, an architecture for an integrated circuit including such a memory cell, and a method of manufacturing such memory, are provided.

A nonvolatile memory according to the described technology comprises memory cells arranged in a series having a first end and a second end, a first pass transistor coupled to the first end of the series, a second pass transistor coupled to the second end of the series, a bit line coupled to the first pass transistor and the second pass transistor, word lines coupled to the gates of the memory cells, and logic coupled to the memory cells. Each memory cell includes a substrate region including source and drain regions, a bottom dielectric coupled to the substrate region, a charge trapping structure coupled to the bottom dielectric having parts corresponding to the source and drain regions, a top dielectric coupled to the charge trapping structure, and a gate coupled to the top dielectric. Each of the parts of the charge trapping structure has a charge storage state, which stores one bit or multiple bits, depending on the application and design of the memory cell. The logic turns on one of the first pass transistor and the second pass transistor to permit electrical coupling of the bit line to the source region or the drain region of a memory cell. This selects part of the charge trapping structure corresponding to the source region or the drain region. For example, if a source region of a selected memory cell is closer to the first end of the series than the drain region of the selected memory cell, then turning on the first pass transistor coupled to the first end of the series selects the part of the charge trapping structure of the selected memory cell which corresponds to the source region. In another example, if a drain region of a selected memory cell is closer to the first end of the series than the source region of the selected memory cell, then turning on the first pass transistor coupled to the first end of the series selects the part of the charge trapping structure of the selected memory cell which corresponds to the drain region.

The voltage difference between the gate and one of the source region or the drain region creates an electric field which causes band bending in one of the source region or the drain region. The degree of band bending is affected by the charge storage state of the part of the charge trapping structure corresponding to one of the source region or the drain region, resulting in a band-to-band tunneling current in one of the source region or the drain region that varies with the charge storage state. In some embodiments, the bias arrangement applies a reverse bias voltage difference between the substrate region and one of the source region or the drain region, and floats the other of the source region or the drain region. Such a bias arrangement results in the avoidance of substantial coupling between the part of the charge trapping structure corresponding to the source region and the part of the charge trapping structure corresponding to the drain region. A current measurement that determines the charge storage state of the charge trapping structure corresponding to the source region is substantially independent of the charge storage state of the charge trapping structure corresponding to the drain region, and vice versa.

In some embodiments, the bias arrangement causes a first voltage difference between the gate and the one of the source region or the drain region, and a second voltage difference between the substrate region and the one of the source and drain regions. The first voltage difference and the second voltage difference cause sufficient band-to-band tunneling current for the measuring. However, the first voltage difference and the second voltage differences fail to change the charge storage state. Thus, the read operation is not destructive of the data stored in the charge trapping structure. In some embodiments the first voltage difference is at least about 5 V between the gate and the one of the source region or the drain region, and the second voltage difference less than about 2 V between the substrate region and the one of the source region or the drain region.

In some embodiments, the substrate region is a well in a semiconductor substrate. In other embodiments, the substrate region is simply the semiconductor substrate.

In some embodiments, the logic applies a second bias arrangement to adjust the charge storage state by increasing a net positive charge in the charge trapping structure, and applies a third bias arrangement to adjust the charge storage state by increasing a net negative charge in the charge trapping structure. Net positive charge is increased in the charge trapping structure via current mechanisms such as band-to-band hot hole tunneling. Net negative charge is increased in the charge trapping structure via current mechanisms such as electron tunneling, Fowler-Nordheim tunneling, channel hot electron injection current, and channel initiated secondary electron injection current. In some embodiments, the measured current is at least about 10 times greater for the charge storage state adjusted by one of the second bias arrangement and the third bias arrangement than said measured current for the charge storage state adjusted by the other of the second bias arrangement and the third bias arrangement, for example about 100 nA for one measurement and about 1 nA for the other measurement.

Other embodiments of the technology described above include a method for selecting a memory cell, and a method of manufacturing nonvolatile memory according to the described technology.

Other aspects and advantages of the technology presented herein can be understood with reference to the figures, the detailed description and the claims, which follow.

BRIEF DESCRIPTION OF THE DRAWINGS

FIG. 6A is a simplified diagram of a string of charge trapping memory cells, showing a read operation being performed on a portion of a selected memory cell.

FIG. 6B is a simplified diagram of a string of charge trapping memory cells, showing a read operation being performed on another portion of a selected memory cell.

FIG. 7A is a simplified diagram of a string of charge trapping memory cells, showing an erase operation being performed on the memory string.

FIG. 7B is a simplified diagram of a string of charge trapping memory cells, showing another erase operation being performed on the memory string.

DETAILED DESCRIPTION

Figure 1A:
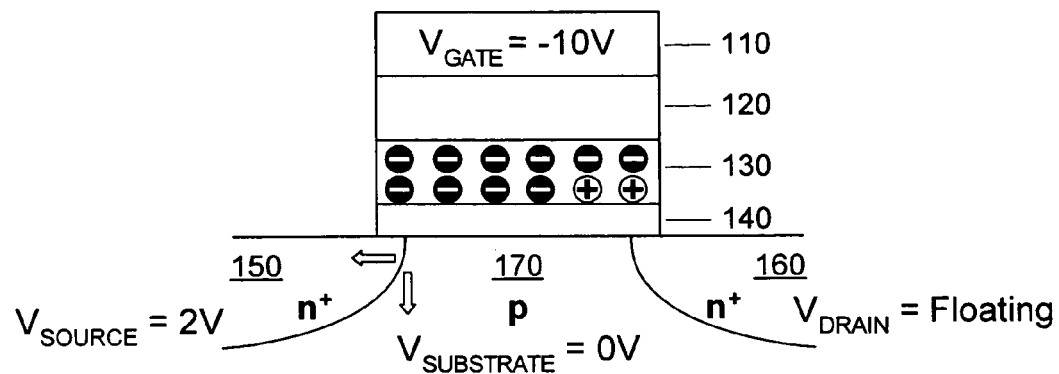
FIG. 1A is a simplified diagram of a charge trapping memory cell, showing a read operation being performed on the portion of the charge trapping structure corresponding to the source side.

FIG. 1A is a simplified diagram of a charge trapping memory cell, showing a read operation being performed on the source side of the charge trapping structure. The p-doped substrate region 170 includes n+ doped source and drain regions 150 and 160. The remainder of the memory cell includes a bottom dielectric structure 140 on the substrate, a charge trapping structure 130 on the bottom dielectric structure 140 (bottom oxide), a top dielectric structure 120 (top oxide) on the charge trapping structure 130, and a gate 110 on the oxide structure 120. Representative top dielectrics include silicon dioxide and silicon oxynitride having a thickness of about 5 to 10 nanometers, or other similar high dielectric constant materials including for example $Al_2O_3$. Representative bottom dielectrics include silicon dioxide and silicon oxynitride having a thickness of about 3 to 10 nanometers, or other similar high dielectric constant materials. Representative charge trapping structures include silicon nitride having a thickness of about 3 to 9 nanometers, or other similar high dielectric constant materials, including metal oxides such as $Al_2O_3$, $HfO_2$, and others. The charge trapping structure may be a discontinuous set of pockets or particles of charge trapping material, or a continuous layer as shown in the drawing.

The memory cell for PHINES-like cells has, for example, a bottom oxide with a thickness ranging from 2 nanometers to 10 nanometers, a charge trapping layer with a thickness ranging from 2 nanometers to 10 nanometers, and a top oxide with a thickness ranging from 2 nanometers to 15 nanometers.

In some embodiments, the gate comprises a material having a work function greater than the intrinsic work function of n-type silicon, or greater than about 4.1 eV, and preferably greater than about 4.25 eV, including for example greater than about 5 eV. Representative gate materials include p-type poly, TiN, Pt, and other high work function metals and materials. Other materials having a relatively high work function suitable for embodiments of the technology include metals including but not limited to Ru, Ir, Ni, and Co, metal alloys including but not limited to Ru—Ti and Ni-T, metal nitrides, and metal oxides including but not limited to $RuO_2$. High work function gate materials result in higher injection barriers for electron tunneling than that of the typical n-type polysilicon gate. The injection barrier for n-type polysilicon gates with silicon dioxide as the top dielectric is around 3.15 eV. Thus, embodiments of the present technology use materials for the gate and for the top dielectric having an injection barrier higher than about 3.15 eV, such as higher than about 3.4 eV, and preferably higher than about 4 eV. For p-type polysilicon gates with silicon dioxide top dielectrics, the injection barrier is about 4.25 eV, and the resulting threshold of a converged cell is reduced about 2 volts relative to a cell having an n-type polysilicon gate with a silicon dioxide top dielectric.

In the diagram of FIG. 1A, the drain side of the memory cell has been programmed, for example via band-to-band hole injection into the drain side of the charge trapping structure 130. The source side of the memory cell has been erased, for example via a channel reset operation injecting electrons via Fowler-Nordheim tunneling from the gate 110 to the charge trapping structure 130, and from the charge trapping structure 130 to the substrate 170.

Figure 1B:
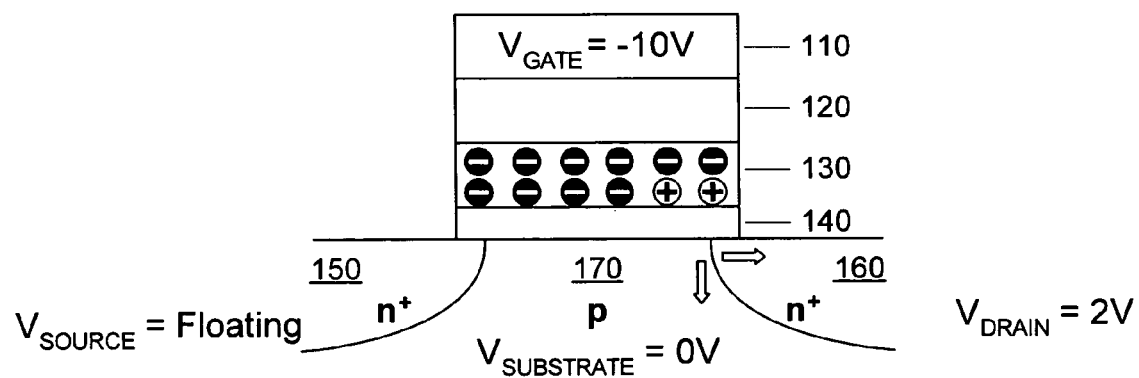
FIG. 1B is a simplified diagram of a charge trapping memory cell, showing a read operation being performed on the portion of the charge trapping structure corresponding to the drain side.

In the bias arrangement of FIG. 1A for reading the source side of the charge trapping structure 130, the voltage of the gate 110 is −10 V, the voltage of the source 150 is 2 V, the voltage of the drain 160 is floating, and the voltage of the substrate 170 is 0 V. The memory cell of FIG. 1B is similar to memory cell of FIG. 1A, except that a read operation is being performed on the drain side of the charge trapping structure rather than on the source side. In the bias arrangement of FIG. 1B for reading the drain side of the charge trapping structure 130, the voltage of the gate 110 is −10 V, the voltage of the source 150 is floating, the voltage of the drain 160 is 2 V, and the voltage of the substrate 170 is 0 V. The bias arrangement is determined among the various terminals, such that the energy bands bend sufficiently to cause band-to-band current in the n+ doped source 150 (FIG. 1A) or the n+ doped drain 160 (FIG. 1B), but to keep the potential difference between the substrate 170 and the source 150 (FIG. 1A) or the drain 160 (FIG. 1B) low enough such that programming does not occur, as discussed in connection with FIG. 2A.

In this bias arrangements of FIGS. 1A and 1B, the area of the junction between the p doped substrate 170, and either the n+ doped source 150 or the n+ doped drain 160, and displays the behavior of a reverse biased p-n junction. However, the gate voltage causes the energy bands to bend sufficiently such that band-to-band tunneling occurs in the n+ doped source 150 (FIG. 1A) or the n+ doped drain 160 (FIG. 1B). The high doping concentration in the source 150 or the drain 160, the resulting high charge density of the space charge region, and the accompanying short length of the space charge region over which the voltage changes, contribute to the sharp energy band bending. Electrons in the valence band tunnel through the forbidden gap to the conduction band and drift down the potential hill, deeper into either the n+ doped source 150 (FIG. 1A) or the n+ doped drain 160 (FIG. 1B). Similarly, holes drift up the potential hill, away from either the n+ doped source 150 (FIG. 1A) or the n+ doped drain 160 (FIG. 1B), and toward the p doped substrate 170.

The voltage of the gate 110 controls the voltage of the portion of the substrate 170 by the bottom dielectric structure 140 (bottom oxide). In turn, the voltage of the portion of the substrate 170 by the bottom dielectric structure 140 (bottom oxide) controls the degree of band bending between the bottom dielectric structure 140 (bottom oxide), and either the n+ doped source 150 (FIG. 1A) or the n+ doped drain 160 (FIG. 1B). As the voltage of the gate 110 becomes more negative, the voltage of the portion of the substrate 170 by the bottom dielectric structure 140 (bottom oxide) becomes more negative, resulting in deeper band bending in either the n+ doped source 150 (FIG. 1A) or the n+ doped drain 160 (FIG. 1B). More band-to-band current flows, as a result of at least some combination of 1) an increasing overlap between occupied electron energy levels on one side of the bending energy bands, and unoccupied electron energy levels on the other side of bending energy bands, and 2) a narrower barrier width between the occupied electron energy levels and the unoccupied electron energy levels (Sze, *Physics of Semiconductor Devices,* 1981).

As mentioned above, the drain side of the charge trapping structure 130 is programmed and occupied by holes, whereas the source side of the charge trapping structure 130 is erased and occupied by fewer holes than the drain side of the charge trapping structure 130. As a result, in accordance with Gauss's Law, when −10 V is applied to the gate 110, the bottom dielectric structure 140 (bottom oxide) is biased more negatively on the source side than on the drain side. Thus, more current flows between the source 150 and the substrate 170 in the bias arrangement shown in FIG. 1A for reading the source side of the charge trapping structure 130 than flows between the drain 160 and the substrate 170 in the bias arrangement shown in FIG. 1B for reading the drain side of the charge trapping structure 130.

Figure 2A:
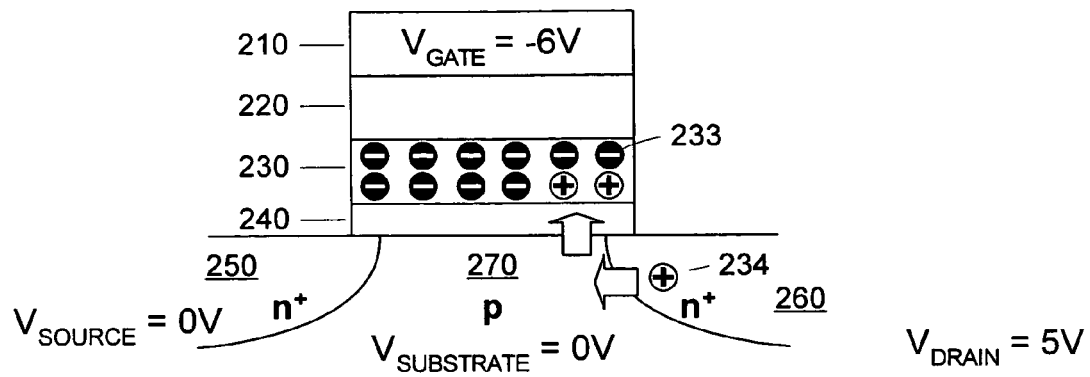
FIG. 2A is a simplified diagram of a charge trapping memory cell, showing a program operation being performed on the portion of the charge trapping structure corresponding to the drain side.

The difference in the bias arrangements of FIGS. 1A and 1B for reading, and the bias arrangement of FIG. 2A for programming, show a careful balance. For reading, the potential difference between the source region or the drain region should not cause a substantial number of carriers to transit the tunnel oxide and affect the charge storage state. In contrast, for programming, the potential difference between the source region or the drain region is sufficient to cause a substantial number of carriers to transit the tunnel oxide and affect the charge storage state.

Figure 2B:
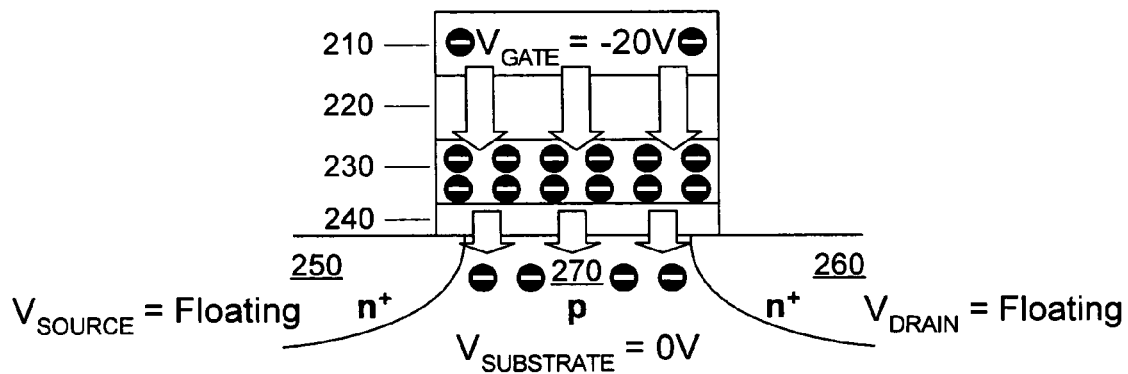
FIG. 2B is a simplified diagram of a charge trapping memory cell, showing an erase operation being performed on the charge trapping structure, with electrons moving in the general direction from the gate to the substrate region.
Figure 2C:
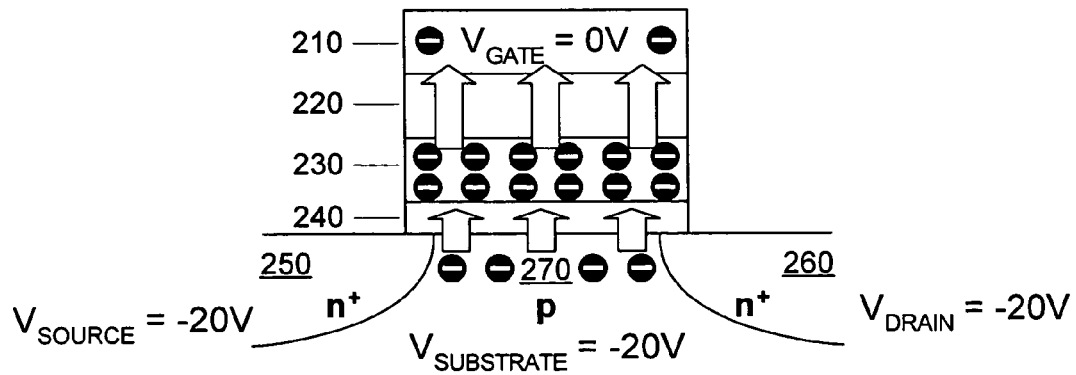
FIG. 2C is a simplified diagram of a charge trapping memory cell, showing another erase operation being performed on the charge trapping structure, with electrons moving in the general direction from the substrate region to the gate.

FIGS. 2A, 2B, and 2C are simplified diagrams of a memory cell that show program and erase operations being performed on the memory cell. As generally used herein, programming refers to making more positive the net charge stored in the charge trapping structure, such as by the addition of holes to or the removal of electrons from the charge trapping. Also as generally used herein, erasing refers to making more negative the net charge stored in the charge trapping structure, such as by the removal of holes from or the addition of electrons to the charge trapping structure. However, the invention encompasses both products and methods where programming refers to making the net charge stored in the charge trapping structure more negative or more positive, and products and methods where erasing refers to making the net charge stored in the charge trapping structure more negative or more positive.

In FIG. 2A, programming is accomplished using band-to-band tunneling induced hot hole injection, and in FIGS. 2B and 2C, erasing is accomplished using the negative gate voltage, E-field induced electron tunneling (also known as Fowler-Nordheim tunneling) which causes tunneling current from the gate to the charge trapping structure, or by using the negative substrate voltage, E-field induced electron tunneling (also known as Fowler-Nordheim tunneling) which causes tunneling current from the substrate to the charge trapping structure. Thus, as illustrated in FIG. 2A, a right bit is programmed by applying 5 V to the drain 260, 0 V to the source 250, and −6 V to the gate 210, while the substrate 270 is grounded. This induces hot holes having sufficient energy to jump over the tunnel dielectric 240 into drain side 233 of the charge trapping structure 230, as shown by hole 234 which is stored in the drain side 233 of the charge trapping structure 230. Similarly, a left bit is programmed by applying 5 V to the source 250, 0 V to the drain 260, and −6 V to the gate 210, while the substrate 270 is grounded (not shown). This induces hot holes having sufficient energy to jump over the bottom dielectric structure 240 into the source side of the charge trapping structure 230. FIG. 2B illustrates E-field assisted electron tunneling across top dielectric structure 220 and bottom dielectric structure 240 used for erase, induced by relatively high negative bias on the gate, and relatively high positive bias on the substrate. Both bits in the memory cell are simultaneously erased in the illustrated example by applying −20 V to the gate, and grounding the substrate, while both the source and the drain are floating. FIG. 2C illustrates E-field assisted electron tunneling used for erase, induced by relatively high negative bias on the substrate, drain, and source; and relatively high positive bias on the gate. Both bits in the memory cell are simultaneously erased in the illustrated example by applying −20 V to the substrate, source, and drain; and grounding the gate. Other program and erase techniques can be used in operation algorithms applied to the PHINES type memory cell, as described for example in U.S. Pat. No. 6,690,601. Other memory cells and other operation algorithms might also be used.

Figure 3A:
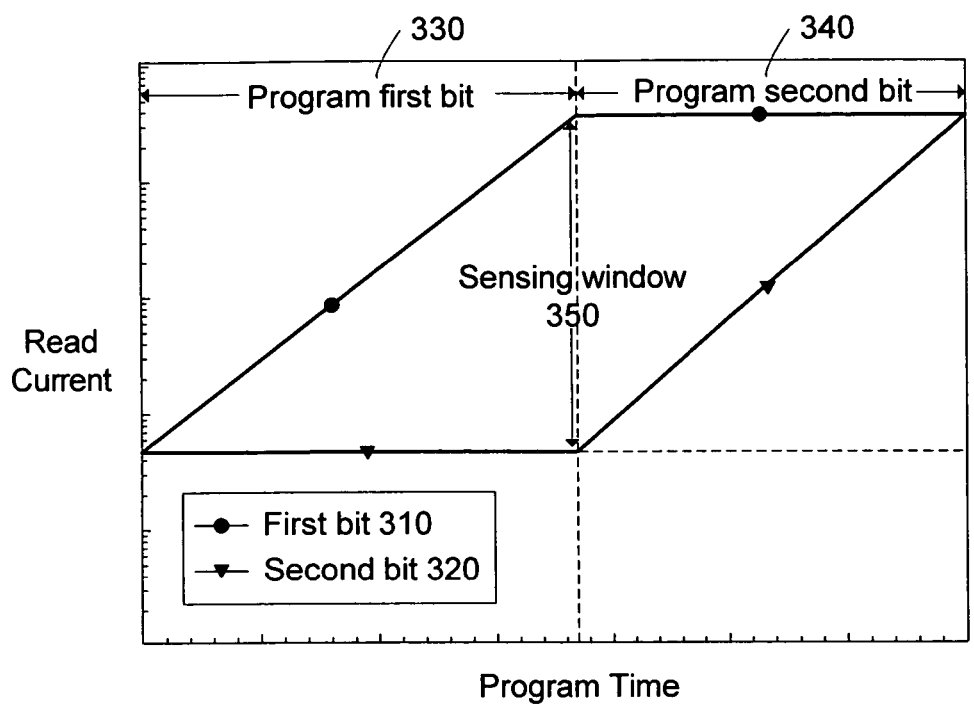
FIG. 3A is a graph showing the sensing window of an ideal memory cell.
Figure 3B:
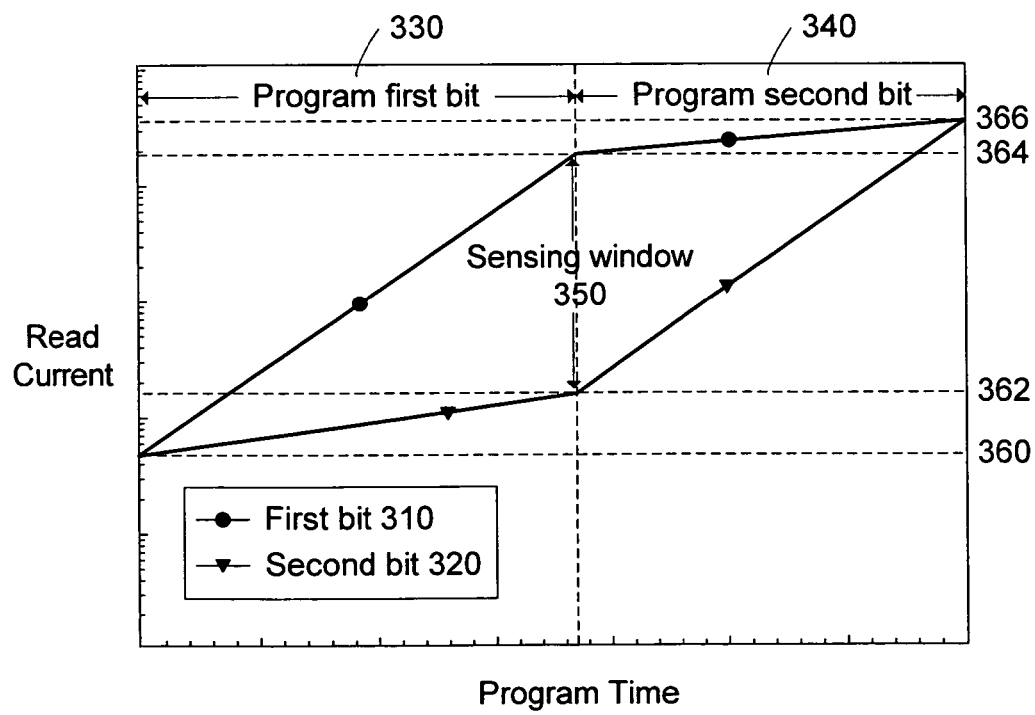
FIG. 3B is a graph showing the sensing window of a typical memory cell.

FIGS. 3A and 3B are graphs that contrast the sensing windows of an ideal memory cell with the sensing window of a memory cell that is read by a reverse read operation. Curve 310 represents the read current of the first bit. Curve 320 represents the read current of the second bit. During time interval 330, the first bit is undergoing programming. During time interval 340, the second bit is undergoing programming. Due to the program operation (via hot hole injection), the current (channel current) will increase in a reverse read operation and the current (BTB current) will drop in a BTB sensing operation. The read current interval is represented by the sensing window 350 of the memory cell.

In FIG. 3A, the ideal memory cell has a relatively wide sensing window 350. During the time interval 330, as the first bit is undergoing programming, the read current curve of the first bit 310 increases from a lowest level to a highest level. The programming of the first bit during the time interval 330 does not substantially affect the read current curve of the second bit 320. During the time interval 340, as the second bit is undergoing programming, the read current curve of the second bit 320 increases from a lowest level to a highest level. The programming of the second bit during the time interval 340 does not substantially affect the read current curve of the first bit 310.

In FIG. 3B, the memory cell read by a reverse read operation has a relatively narrow sensing window 350 due to the second bit effect, as explained below. During the time interval 330, as the first bit is undergoing programming, the read current curve of the first bit 310 increases from a lowest level 360 to a high level 364. Consequently, the programming of the first bit during the time interval 330 substantially affects the read current curve of the second bit 320, which increases from a lowest level 360 to a low level 362. During the time interval 340, as the second bit is undergoing programming, the read current curve of the second bit 320 increases from a low level 362 to a highest level 366. Consequently, the programming of the second bit during the time interval 340 substantially affects the read current curve of the first bit 310, which increases from a high level 364 to a highest level 366. Thus, when performing a reverse read operation on a memory cell on one bit, the resulting read current is substantially affected by the programmed or erased status of the other bit, because for a given gate voltage it becomes more difficult during the reverse read operation to force the substrate portion under the other bit into depletion and inversion, and to punch through the portion of the substrate under the other bit.

Figure 4A:
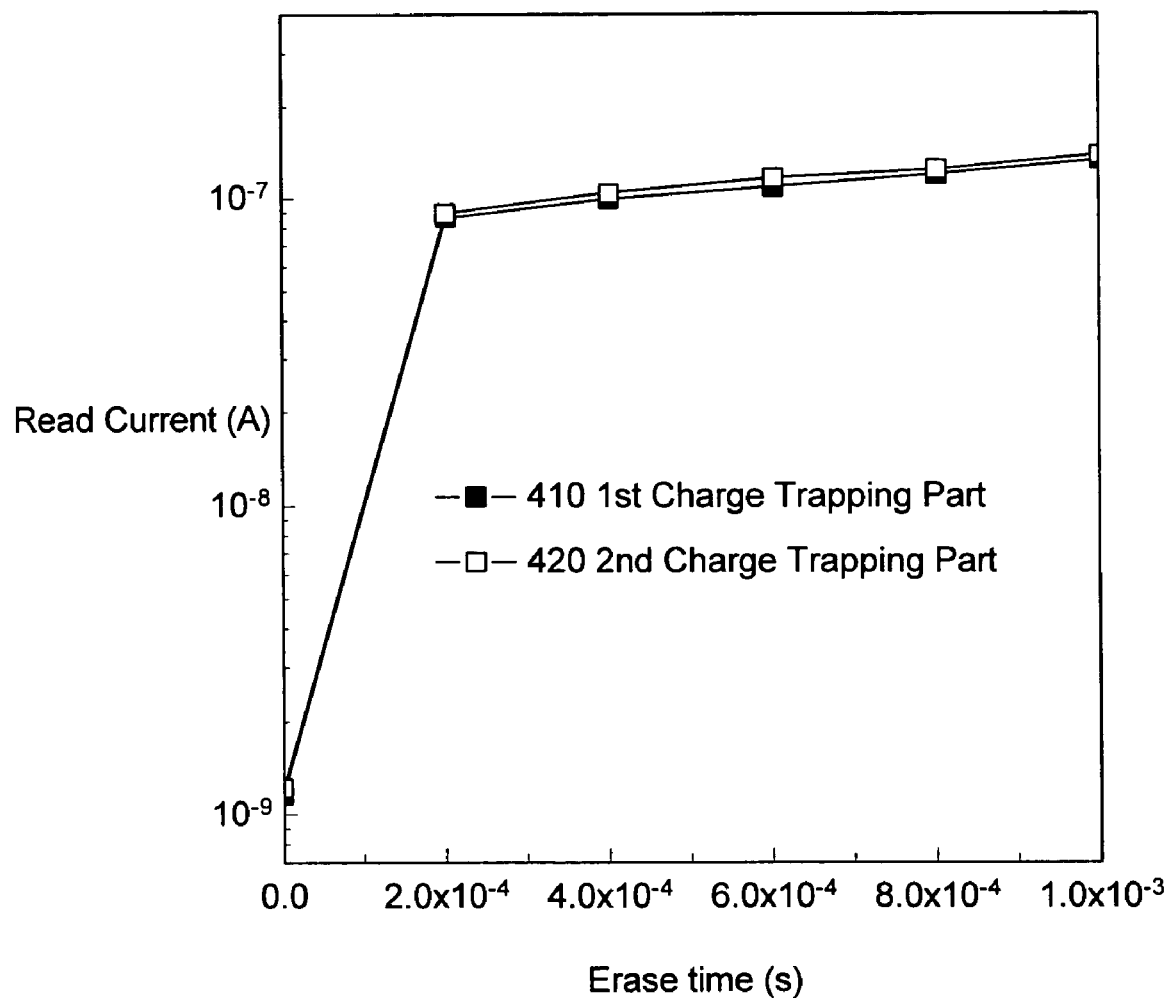
FIG. 4A is a graph showing an erase operation being performed on a memory cell.
Figure 4B:
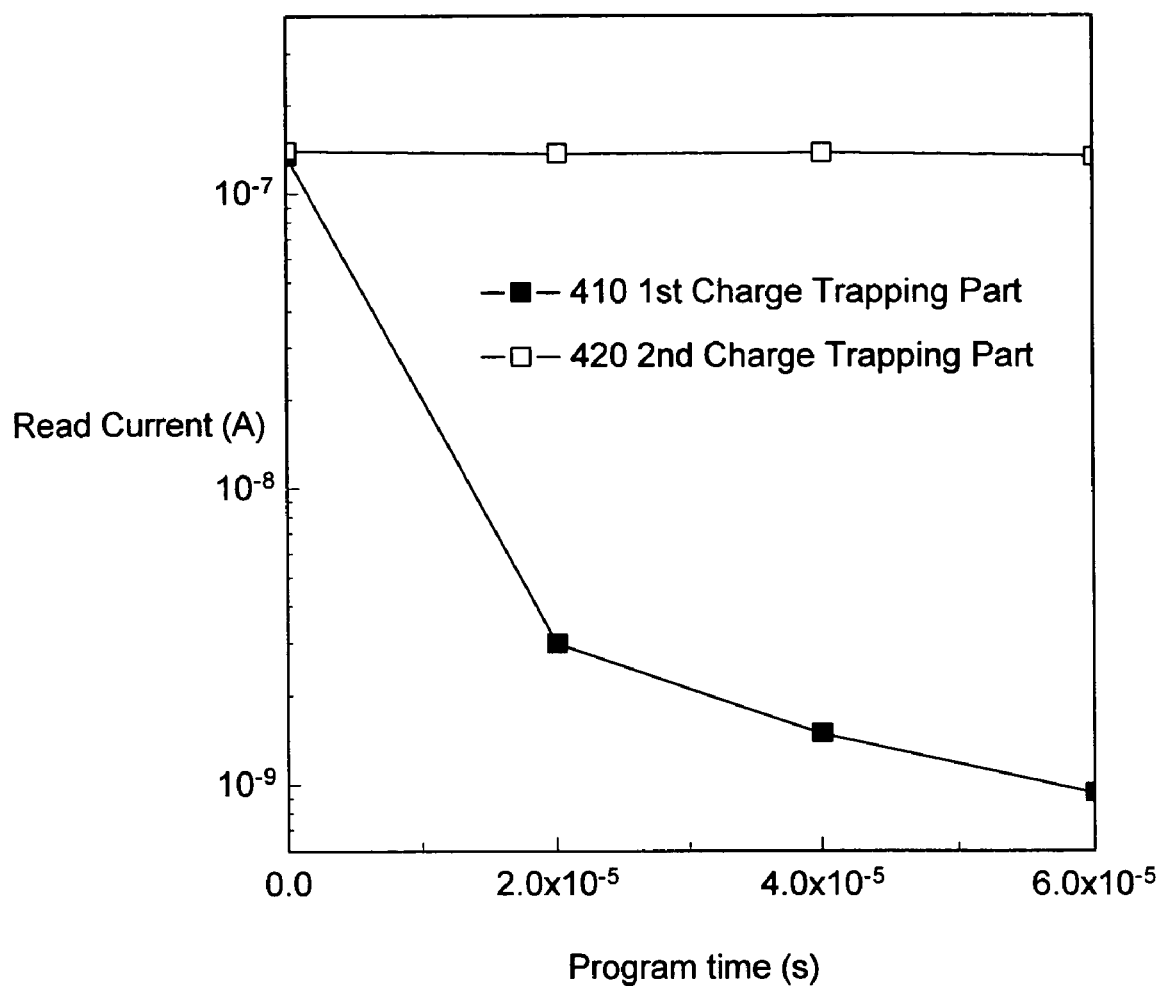
FIG. 4B is a graph showing a program operation being performed on part of the charge trapping structure of a memory cell.
Figure 4C:
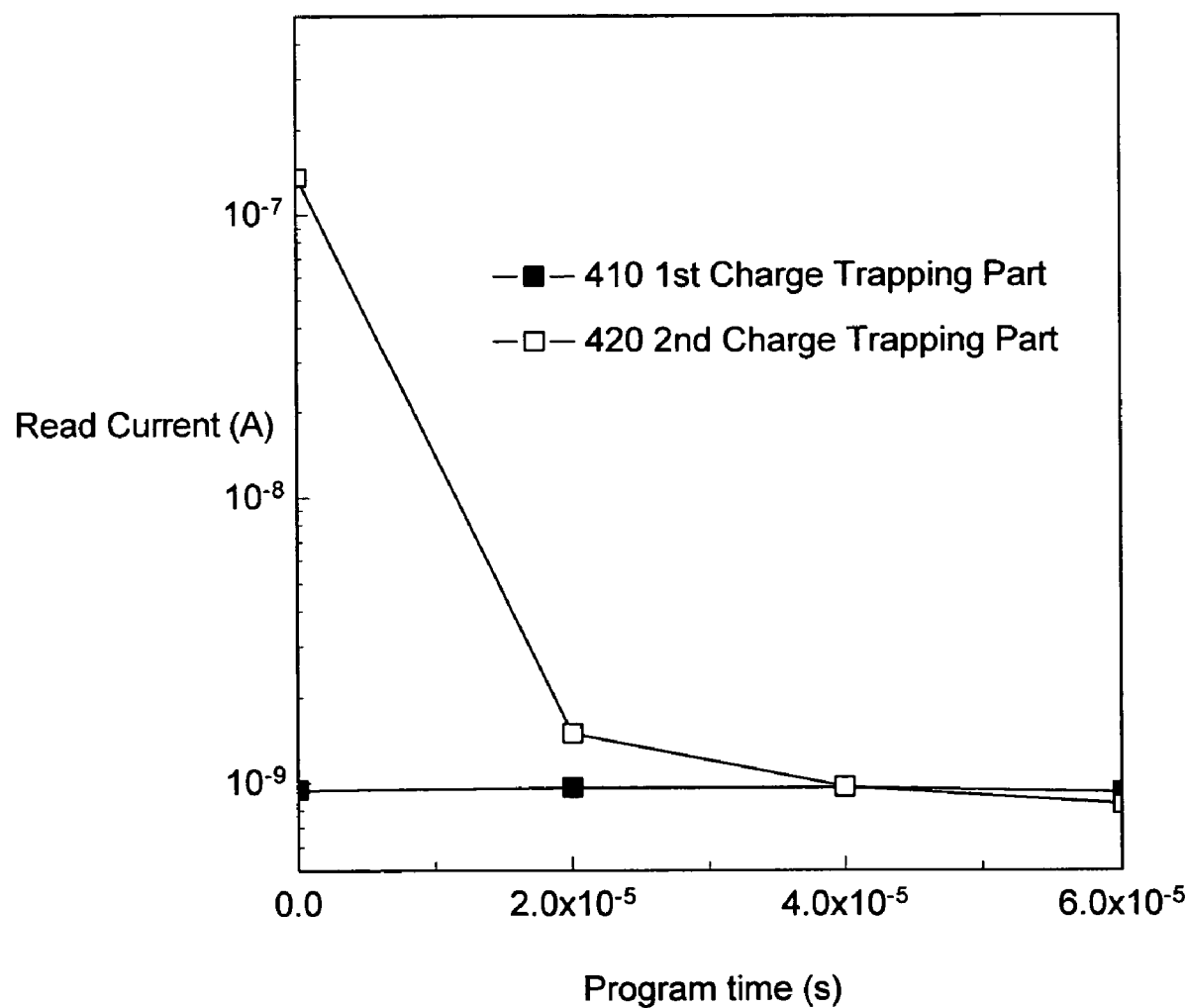
FIG. 4C is a graph showing a program operation being performed on another part of the charge trapping structure of a memory cell.

FIGS. 4A, 4B, and 4C are graphs that show program, erase, and band-to-band read operations being performed on the memory cell.

In the graph of FIG. 4A, a memory cell with both first and second charge trapping parts in a programmed state are erased via E-field assisted electron tunneling, induced by relatively high negative bias on the gate, and relatively high positive bias on the substrate. Both charge trapping parts in the memory cell are simultaneously erased in the graph by applying −19.5 V to the gate, and grounding the substrate, while both the source and the drain are floating. For each data point, the read operation is performed by applying −10 V to the gate, 2 V to one of the drain or source depending on the portion of the charge trapping structure being read, floating the other terminal of the drain or source, and grounding the substrate. If the source side of the charge trapping structure is being read, then 2 V is applied to the source and the drain is floated. If the drain side of the charge trapping structure is being read, then 2 V is applied to the drain and the source is floated.

In the graph of FIG. 4B, the first charge trapping part undergoes programming, and in the graph of FIG. 4C, the second charge trapping part undergoes programming. Curve 410 represents the read current of the first charge trapping part. Curve 420 represents the read current of the second charge trapping part. In FIG. 4B, the first charge trapping part is programmed by applying −8V to the gate and 5 V to the first terminal (the terminal closer to the storing the first charge trapping part of the charge trapping structure), floating the second terminal (the terminal farther from the first charge trapping part of the charge trapping structure), and grounding the substrate. In FIG. 4B, as the first charge trapping part is undergoing programming, the read current curve of the first charge trapping part 410 drops from a highest level of about 100 nA to a lowest level of about 1 nA. The programming of the first charge trapping part does not substantially affect the read current curve of the second charge trapping part 420. In FIG. 4C, the second charge trapping part is programmed by applying −8V to the gate and 5 V to the second terminal (the terminal closer to the second charge trapping part of the charge trapping structure), floating the first terminal (the terminal farther from the second charge trapping part of the charge trapping structure storing), and grounding the substrate. In FIG. 4C, as the second charge trapping part is undergoing programming, the read current curve of the second charge trapping part 420 drops from a highest level of about 100 nA to a lowest level of about 1 nA. The programming of the second charge trapping part does not substantially affect the read current curve of the first charge trapping part 410. For each data point in FIGS. 4B and 4C, the read operation is performed by applying −10 V to the gate, 2 V to one of the drain or source depending on the portion of the charge trapping structure being read, floating the other terminal of the drain or source, and grounding the substrate. If the source side of the charge trapping structure is being read, then 2 V is applied to the source and the drain is floated. If the drain side of the charge trapping structure is being read, then 2 V is applied to the drain and the source is floated.

The sensing window shown in FIGS. 4B and 4C is relatively wide, because the band-to-band read operation is local to either the first terminal or the second terminal. The read current resulting from a band-to-band read operation performed on the first charge trapping part is relatively insensitive to the logical state of the second charge trapping part, and the read current resulting from a band-to-band read operation performed on the second charge trapping part is relatively insensitive to the logical state of the first charge trapping part. The band-to-band read operation is relatively free of the second charge trapping part effect which characterizes the reverse read operation, where the read current resulting from a read operation performed on one side of the charge trapping structure is relatively dependent on the data stored on the other side of the charge trapping structure. Each charge trapping part can store one bit or multiple bits. For example, if each charge trapping part stores two bits, then there are four discrete levels of charge.

Figure 5A:
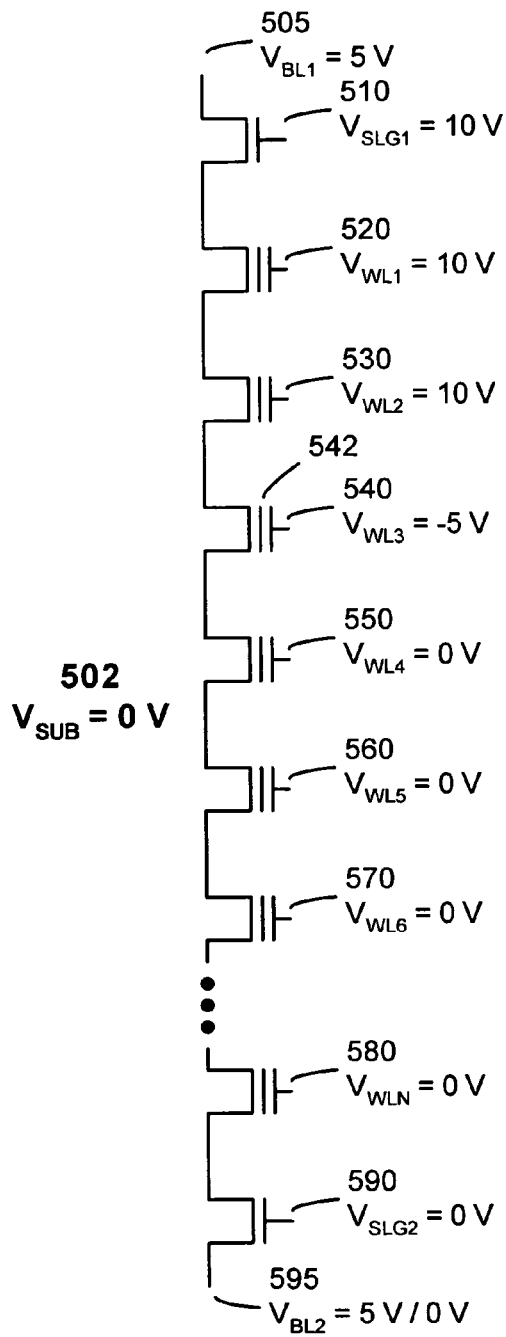
FIG. 5A is a simplified diagram of a string of charge trapping memory cells, showing a program operation being performed on a portion of a selected memory cell.
Figure 5B:
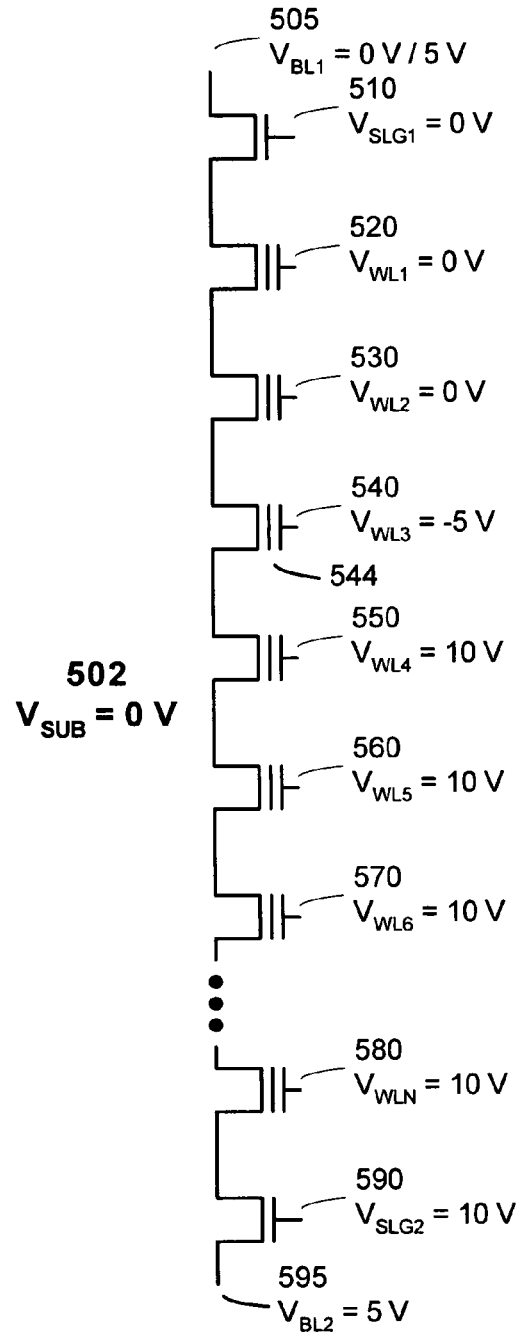
FIG. 5B is a simplified diagram of a string of charge trapping memory cells, showing a program operation being performed on another portion of a selected memory cell.

FIGS. 5A and 5B are simplified diagrams of memory cell strings that show program operations being performed on the memory cell.

In FIG. 5A, one of the memory cells of the string of memory cells including N memory cells coupled in series is programmed. The voltage of the substrate 502 is 0 V. The gate of the memory cell 540 selected to be programmed has a voltage of −5 V. More specifically, one portion of the charge trapping structure 542 is selected to be programmed. The portion of the charge trapping structure to be programmed 542 is selected by applying a voltage of 10 V to the gate of the pass transistor 510, turning on the pass transistor 510. Further, a voltage of 10 V is applied to the gates of memory cells 520 and 530. These gate voltages electrically couple a first bit line 505 with a voltage of 5 V to one of the source/drain region of the selected memory cell 540. The selected portion of the charge trapping structure 542 corresponding to one of the source/drain region is programmed, for example via band-to-band hot hole programming. The remaining transistors in the string of memory cells are turned off by applying a voltage of 0 V to the gates of memory cells 550, 560, 570, and 580; and to the gate of the pass transistor 590. These gate voltages electrically decouple a second bit line 595 from the other of the source/drain region of the selected memory cell 540. The unselected portion of the charge trapping structure corresponding to the other of the source/drain region is not programmed.

In FIG. 5B, one of the memory cells of the string of memory cells including N memory cells coupled in series is programmed. However, a gate voltage of 0 V is applied to the gate of the pass transistor 510 and to the gates of the memory cells 520 and 530. Also, a gate voltage of 10 V is applied to the gate of the pass transistor 590 and to the gates of the memory cells 550, 560, 570, and 580. In contrast with the bias arrangement of FIG. 5A, where the bit line 505 is electrically coupled to one of the source or drain of the memory cell 540 to program the portion of the charge trapping structure 542, in the bias arrangement of FIG. 5B the bit line 595 is electrically coupled to the other of the source or drain of the memory cell 540 to program the portion of the charge trapping structure 544.

FIGS. 6A and 6B are simplified diagrams of memory cell strings that show read operations being performed on the memory cell.

In FIG. 6A, one of the memory cells of the string of memory cells including N memory cells coupled in series is read. The voltage of the substrate 602 is 0 V. The gate of the memory cell 640 selected to be read has a voltage of −10 V. More specifically, one portion of the charge trapping structure 642 is selected to be read. The portion of the charge trapping structure to be read 642 is selected by applying a voltage of 10 V to the gate of the pass transistor 610, turning on the pass transistor 610. Further, a voltage of 10 V is applied to the gates of memory cells 620 and 630. These gate voltages electrically couple a first bit line 605 with a voltage of 2 V to one of the source/drain region of the selected memory cell 640. The selected portion of the charge trapping structure 642 corresponding to one of the source/drain region is read for example via band-to-band current sensing. The remaining transistors in the string of memory cells are turned off by applying a voltage of 0 V to the gates of memory cells 650, 660, 670, and 680; and to the gate of the pass transistor 690. These gate voltages electrically decouple a second bit line 695 from the other of the source/drain region of the selected memory cell 640. The unselected portion of the charge trapping structure corresponding to the other of the source/drain region is not read.

In FIG. 6B, one of the memory cells of the string of memory cells including N memory cells coupled in series is programmed. However, a gate voltage of 0 V is applied to the gate of the pass transistor 610 and to the gates of the memory cells 620 and 630. Also, a gate voltage of 10 V is applied to the gate of the pass transistor 690 and to the gates of the memory cells 660, 660, 670, and 680. In contrast with the bias arrangement of FIG. 6A, where the first bit line 605 is electrically coupled to one of the source or drain of the memory cell 640 to read the portion of the charge trapping structure 642, in the bias arrangement of FIG. 6B the second bit line 695 is electrically coupled to the other of the source or drain of the memory cell 640 to read the portion of the charge trapping structure 644.

FIGS. 7A and 7B are simplified diagrams of memory cell strings that show erase operations being performed on the memory cells.

In FIG. 7A, all of the memory cells of the string of memory cells including N memory cells coupled in series are erased. The voltage of the substrate 702 is 10 V. The gates of the memory cells to be erased 720, 730, 740, 750, 760, 770, and 780 have a voltage of −10 V. The gates of pass transistors 710 and 790 are floating. The bit lines 705 and 795 are floating. The memory cells 720, 730, 740, 750, 760, 770, and 780 are erased, for example via FN tunneling of electrons from the gate to the charge trapping structure and from the charge trapping structure to the substrate.

In FIG. 7B, all of the memory cells of the string of memory cells including N memory cells coupled in series are erased. The voltage of the substrate 702 is −10 V. The gates of the memory cells to be erased 720, 730, 740, 750, 760, 770, and 780 have a voltage of 10 V. The voltage of the gates of pass transistors 710 and 790 is 5V. The voltage of bit lines 705 and 795 is −10V. The memory cells 720, 730, 740, 750, 760, 770, and 780 are erased, for example via FN tunneling of electrons from the substrate to the charge trapping structure and from the charge trapping structure to the gate.

Figure 8:
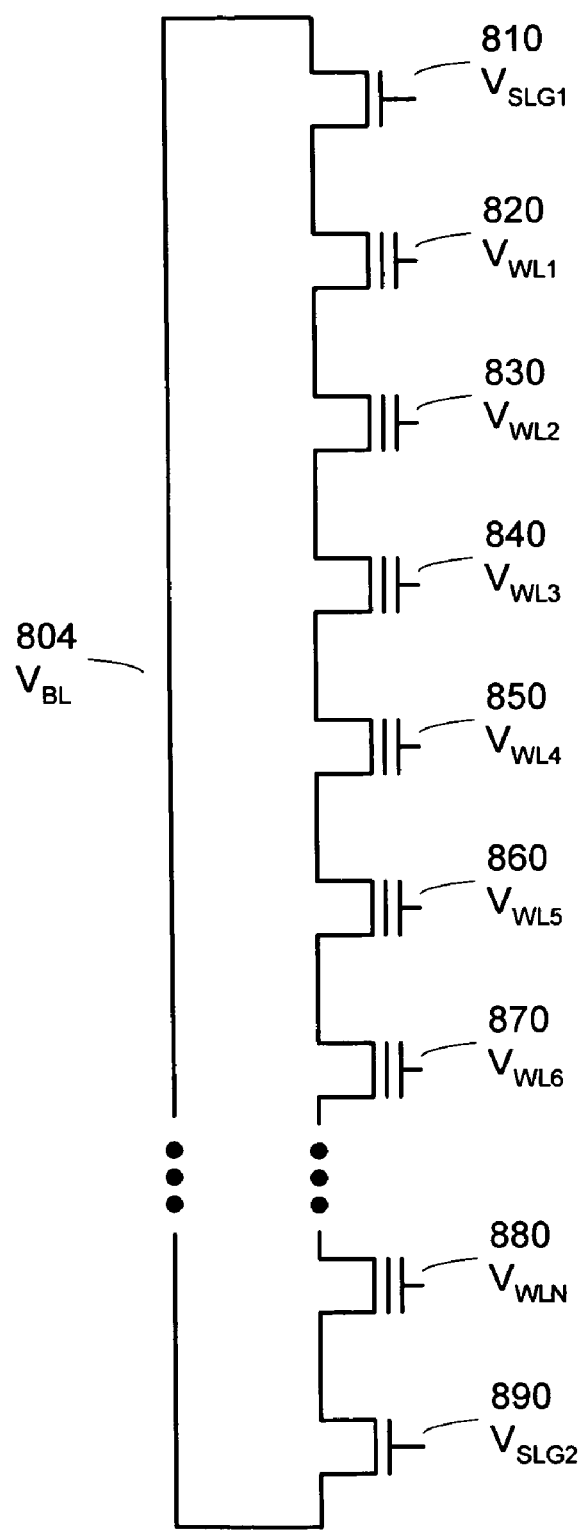
FIG. 8 is a simplified diagram of a string of charge trapping memory cells, showing both ends of the memory string electrically coupled to a common bit line.

In FIG. 8, each column of memory cells is electrically coupled to at most one bit line 804. Stated another way, the architecture in FIG. 8 differs from the architecture of FIG. 6 in that the first bit line 605 and the second bit line 695 are permanently electrically coupled. Memory cells in the column of memory cells are selected by turning on word lines which set the gate voltages of the memory cells 820, 830, 840, 850, 860, 870, and 880. An example of a way to control which portion of a given memory cell is read or programmed is by turning on one of pass transistors 810 and 890 and turning off the other of pass transistors 810 and 890. Although the pass transistors 810 and 890 shown in FIG. 8 are not memory cells, in other embodiments one or both pass transistors 810 and 890 are also memory cells with charge trapping structures.

Figure 9:
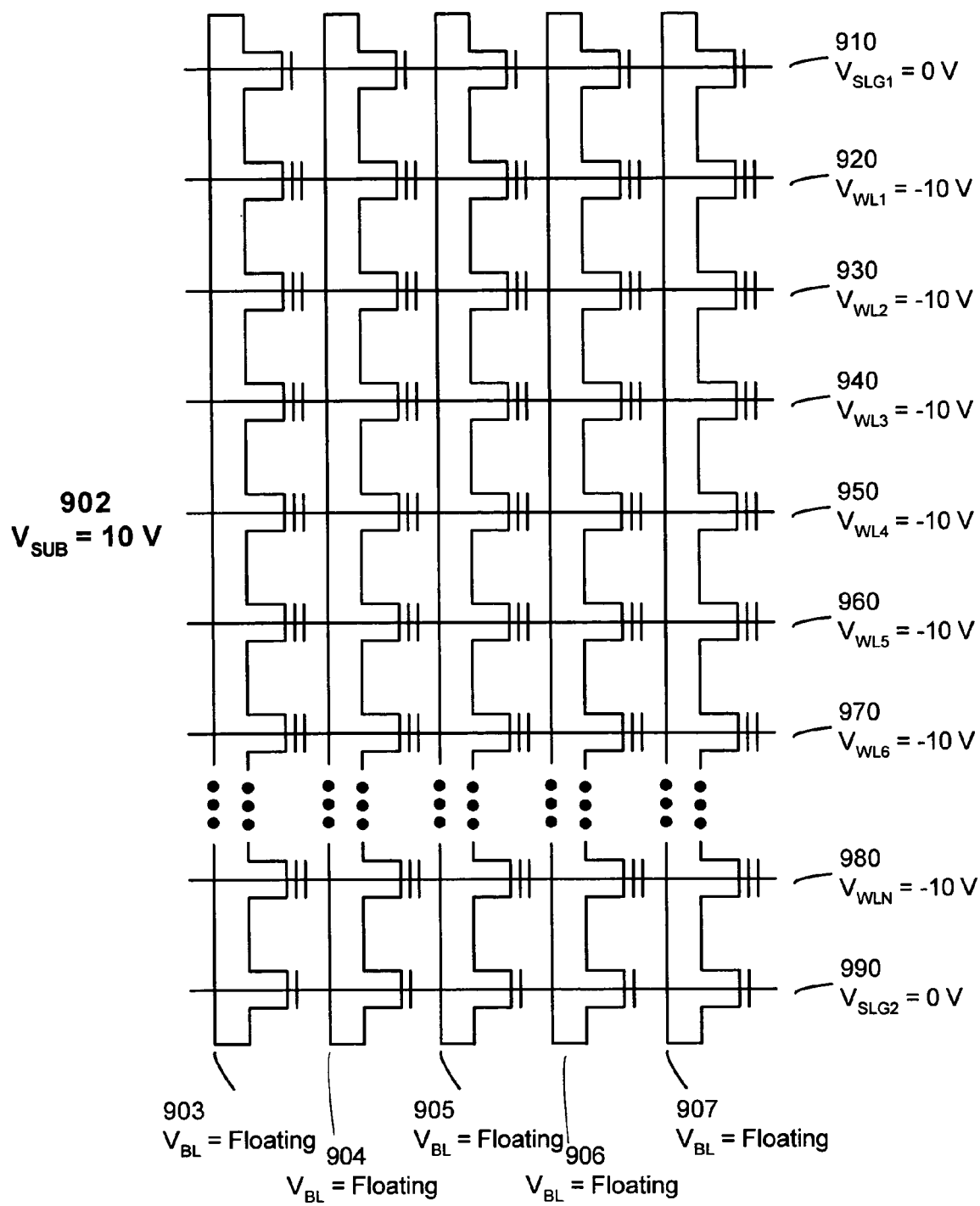
FIG. 9 is a simplified diagram of an array of charge trapping memory cells, showing an erase operation being performed on the memory array.

In FIG. 9, an array of memory cells is erased, with multiple strings each including N memory cells coupled in series. The voltage of the substrate 902 is 10 V. The word lines of the memory cells to be erased 920, 930, 940, 950, 960, 970, and 980 have a voltage of −10 V. The word lines of pass transistors 910 and 990 have a voltage of 0 V. The bit lines 903, 904, 905, 906, and 907 are floating. The memory cells of the array are erased, for example via FN tunneling of electrons from the gate to the charge trapping structure and from the charge trapping structure to the substrate.

Figure 10:
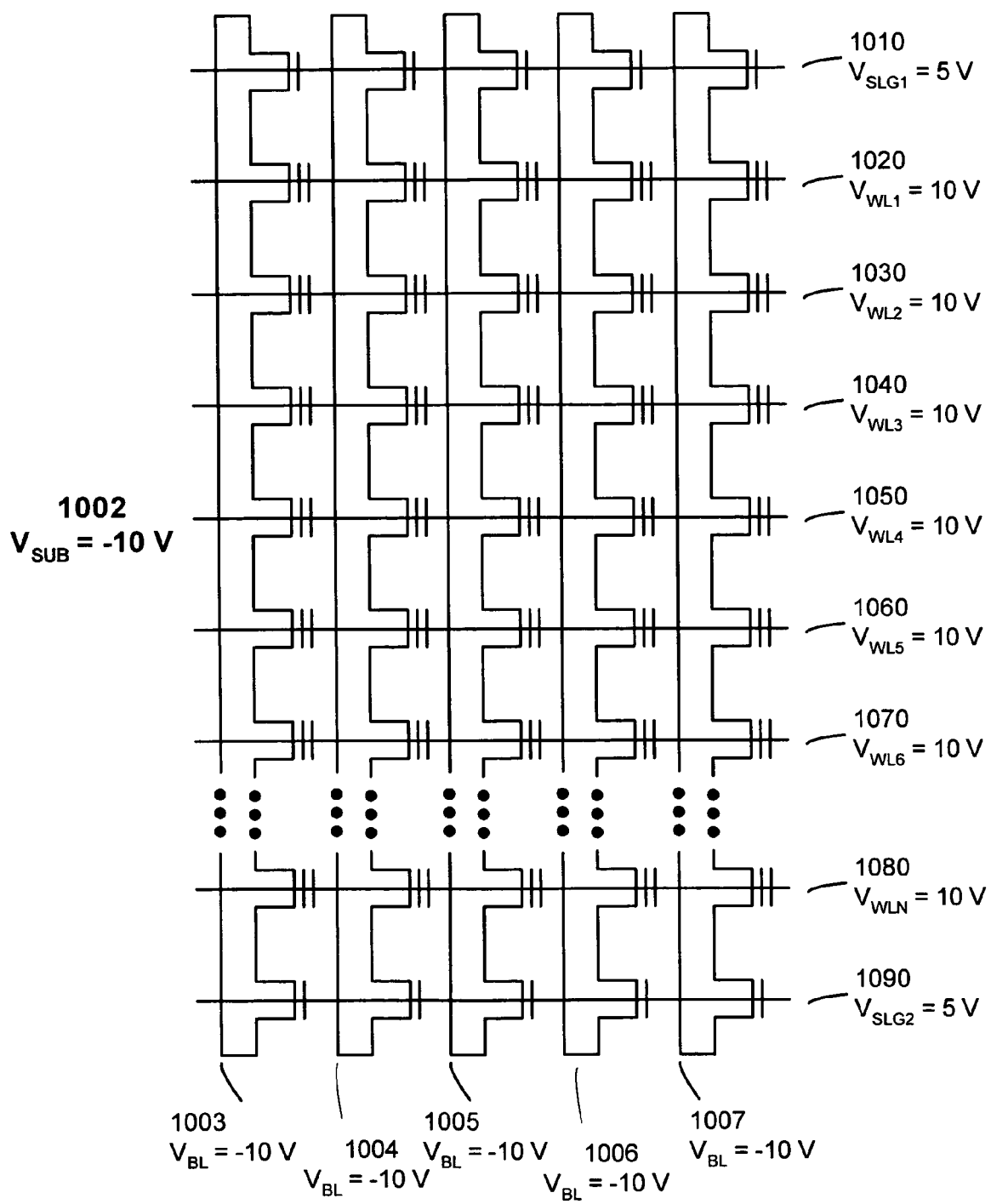
FIG. 10 is a simplified diagram of an array of charge trapping memory cells, showing another erase operation being performed on the memory array.

In FIG. 10, an array of memory cells is erased, with multiple strings each including N memory cells coupled in series. The voltage of the substrate 1002 is −10 V. The word lines of the memory cells to be erased 1020, 1030, 1040, 1050, 1060, 1070, and 1080 have a voltage of 10 V. The word lines of pass transistors 1010 and 1090 have a voltage of 5 V. The bit lines 1003, 1004, 1005, 1006, and 1007 have a voltage of −10 V. The memory cells of the array are erased, for example via FN tunneling of electrons from the substrate (including drain and source) to the charge trapping structure and from the charge trapping structure to the gate.

Figure 11:
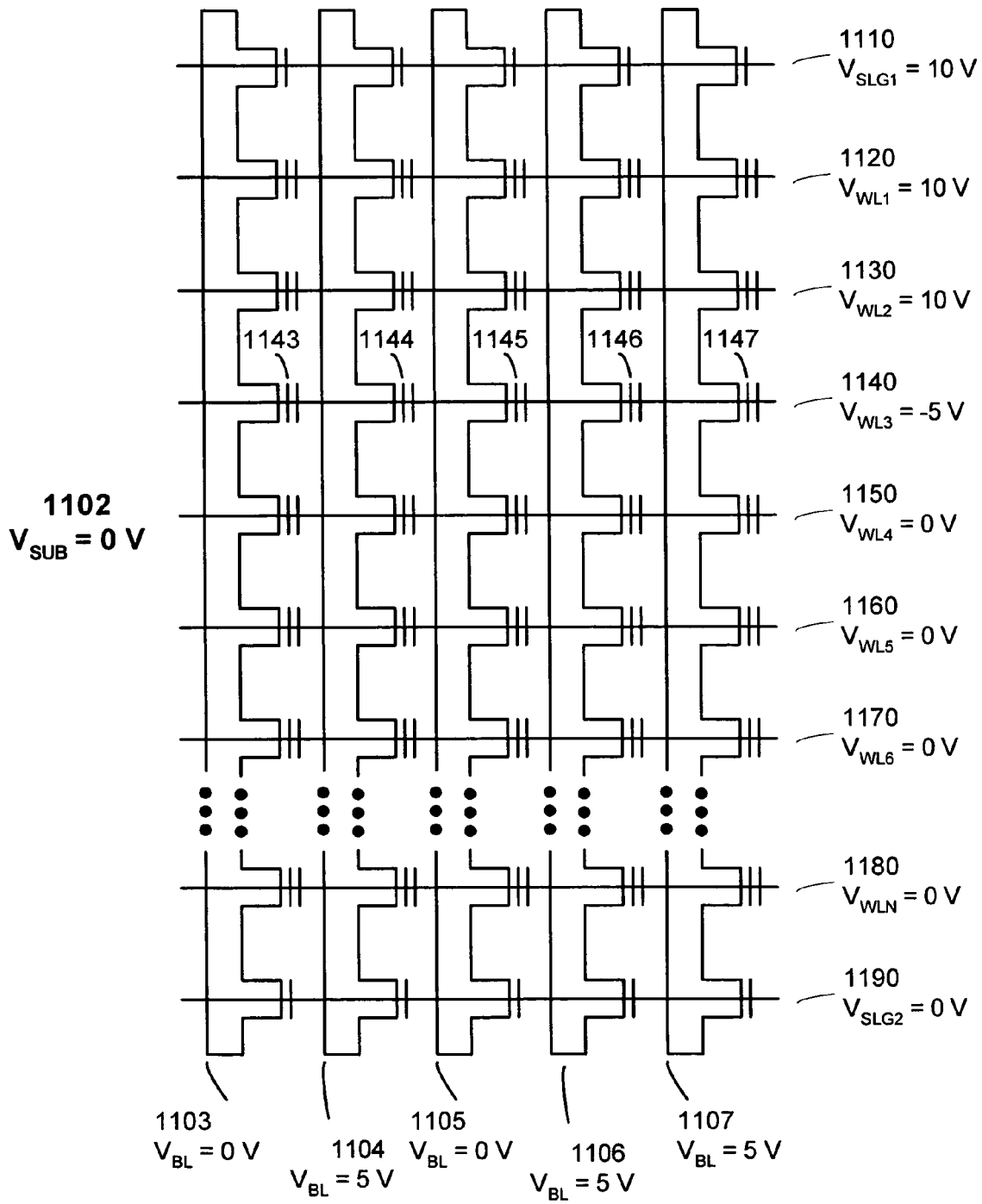
FIG. 11 is a simplified diagram of an array of charge trapping memory cells, showing a program operation being performed on one portion of selected cells of the memory array.

In FIG. 11, several memory cells are programmed in an array of memory cells with multiple strings each including N memory cells coupled in series. The voltage of the substrate 1102 is 0 V. The word line 1140 of the memory cells to be programmed has a voltage of −5 V. With the memory cells selected by the word line 1140, the charge trapping structure parts 1143, 1144, 1145, 1146, and 1147 are selected by turning on the pass transistor word line 1110 with a voltage of 10 V. The voltages of the intervening memory cell word lines 1120 and 1130 is set to 10 V. The other pass transistor word line 1190 and the remaining memory cell word lines 1150, 1160, 1170, and 1180 are turned off with a voltage of 0 V. Out of the selected charge trapping structure parts 1143, 1144, 1145, 1146, and 1147, the charge trapping structure parts 1144, 1146, and 1147 are programmed by setting the voltages of the bit lines 1104, 1106, and 1107 to 5 V. Out of the selected charge trapping structure parts 1143, 1144, 1145, 1146, and 1147, the charge trapping structure parts 1143 and 1145 are not programmed, by setting the voltages of the bit lines 1103 and 1105 to 0 V.

Figure 12:
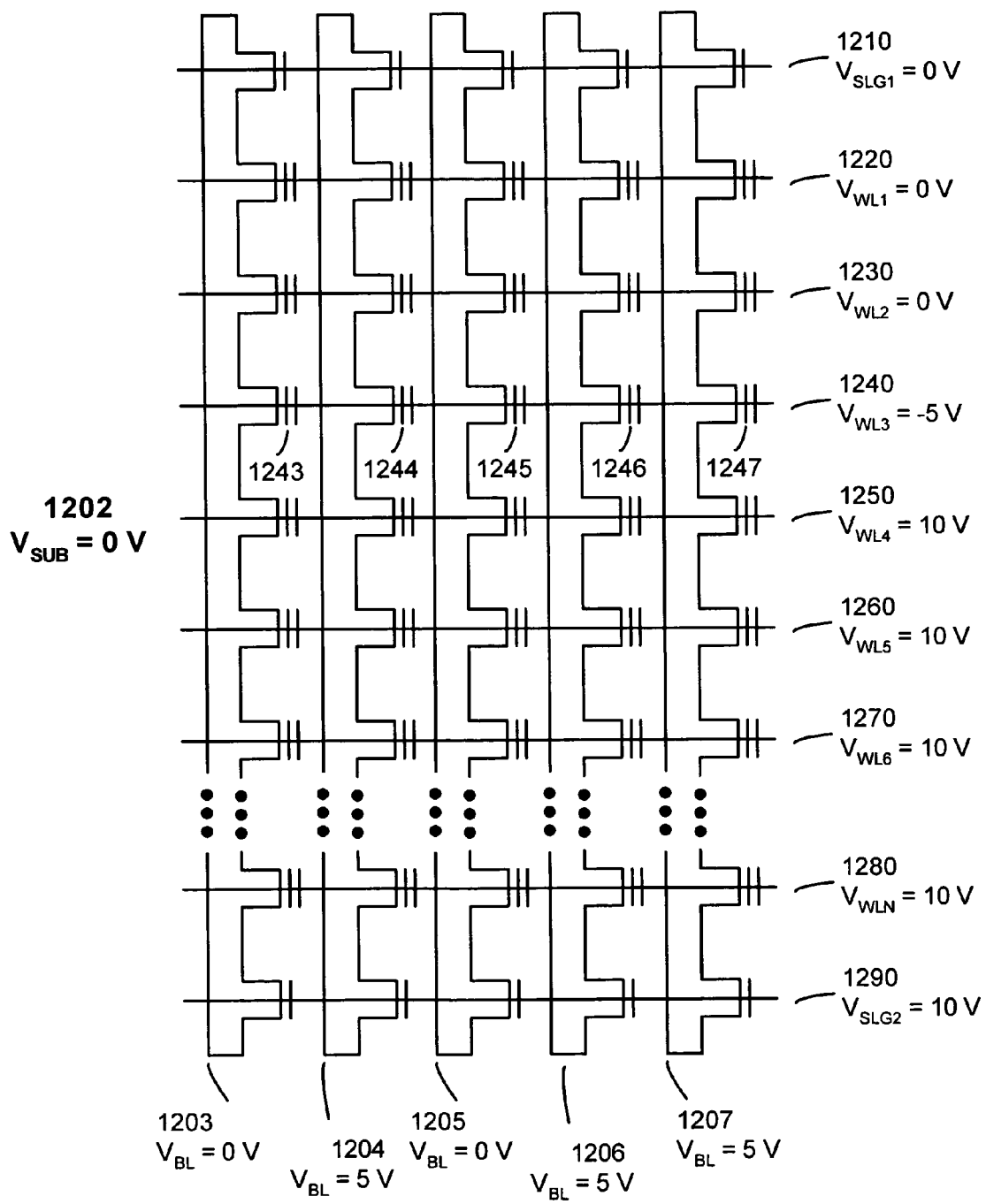
FIG. 12 is a simplified diagram of an array of charge trapping memory cells, showing a program operation being performed on another portion of selected cells of the memory array.

In FIG. 12, several memory cells are programmed similar to FIG. 11. The voltage of the substrate 1202 is 0 V. However, with the memory cells selected by the word line 1240, the charge trapping structure parts 1243, 1244, 1245, 1246, and 1247 are selected by turning on the pass transistor word line 1290 with a voltage of 10 V. The voltages of the intervening memory cell word lines 1250, 1260, 1270, and 1280 is set to 10 V. The other pass transistor word line 1210 and the remaining memory cell word lines 1220 and 1230 are turned off with a voltage of 0 V. Out of the selected charge trapping structure parts 1243, 1244, 1245, 1246, and 1247, the charge trapping structure parts 1244, 1246, and 1247 are programmed by setting the voltages of the bit lines 1204, 1206, and 1207 to 5 V. Out of the selected charge trapping structure parts 1243, 1244, 1245, 1246, and 1247, the charge trapping structure parts 1243 and 1245 are not programmed, by setting the voltages of the bit lines 1203 and 1205 to 0 V.

Figure 13:
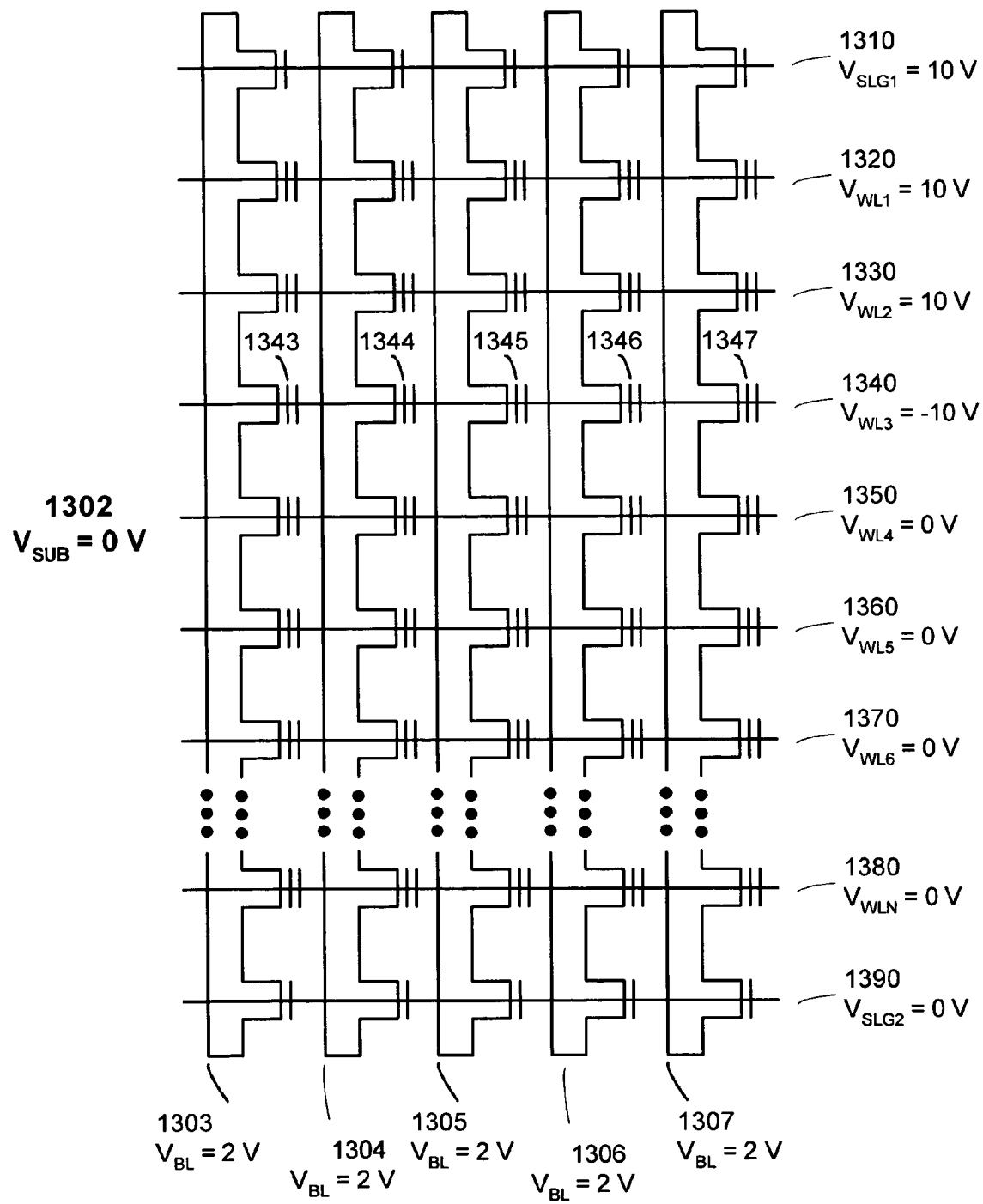
FIG. 13 is a simplified diagram of an array of charge trapping memory cells, showing a read operation being performed on one portion of selected cells of the memory array.

In FIG. 13, several memory cells are read in an array of memory cells with multiple strings each including N memory cells coupled in series. The voltage of the substrate 1302 is 0 V. The word line 1340 of the memory cells to be read has a voltage of −10 V. With the memory cells selected by the word line 1340, the charge trapping structure parts 1343, 1344, 1345, 1346, and 1347 are selected by turning on the pass transistor word line 1310 with a voltage of 10 V. The voltages of the intervening memory cell word lines 1320 and 1330 are set to 10 V. The other pass transistor word line 1390 and the remaining memory cell word lines 1350, 1360, 1370, and 1380 are turned off with a voltage of 0 V. The selected charge trapping structure parts 1343, 1344, 1345, 1346, and 1347, are read by setting the voltages of the bit lines 1303, 1304, 1305, 1306, and 1307 to 2 V. In other embodiments, a subset of all the bit lines are read by setting the voltages to 2 V for only the bit lines of interest.

Figure 14:
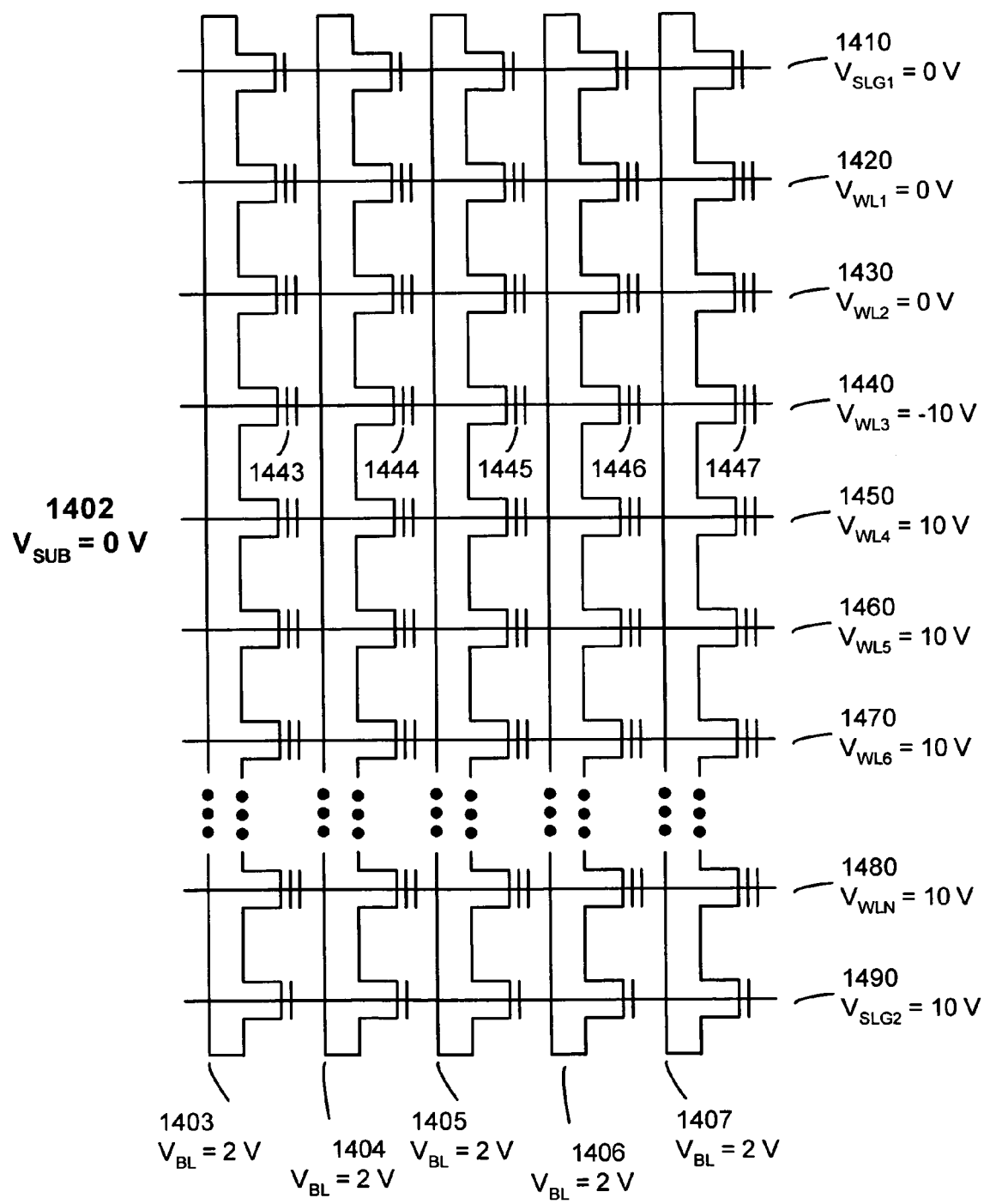
FIG. 14 is a simplified diagram of an array of charge trapping memory cells, showing a read operation being performed on another portion of selected cells of the memory array.

In FIG. 14, several memory cells are read similar to FIG. 13. The voltage of the substrate 1402 is 0 V. However, with the memory cells selected by the word line 1440, the charge trapping structure parts 1443, 1444, 1445, 1446, and 1447 are selected by turning on the pass transistor word line 1490 with a voltage of 10 V. The voltages of the intervening memory cell word lines 1450, 1460, 1470, and 1480 are set to 10 V. The other pass transistor word line 1410 and the remaining memory cell word lines 1420 and 1430 are turned off with a voltage of 0 V. The selected charge trapping structure parts 1443, 1444, 1445, 1446, and 1447, are read by setting the voltages of the bit lines 1403, 1404, 1405, 1406, and 1407 to 2 V. In other embodiments, a subset of all the bit lines are read by setting the voltages to 2 V for only the bit lines of interest.

Figure 15:
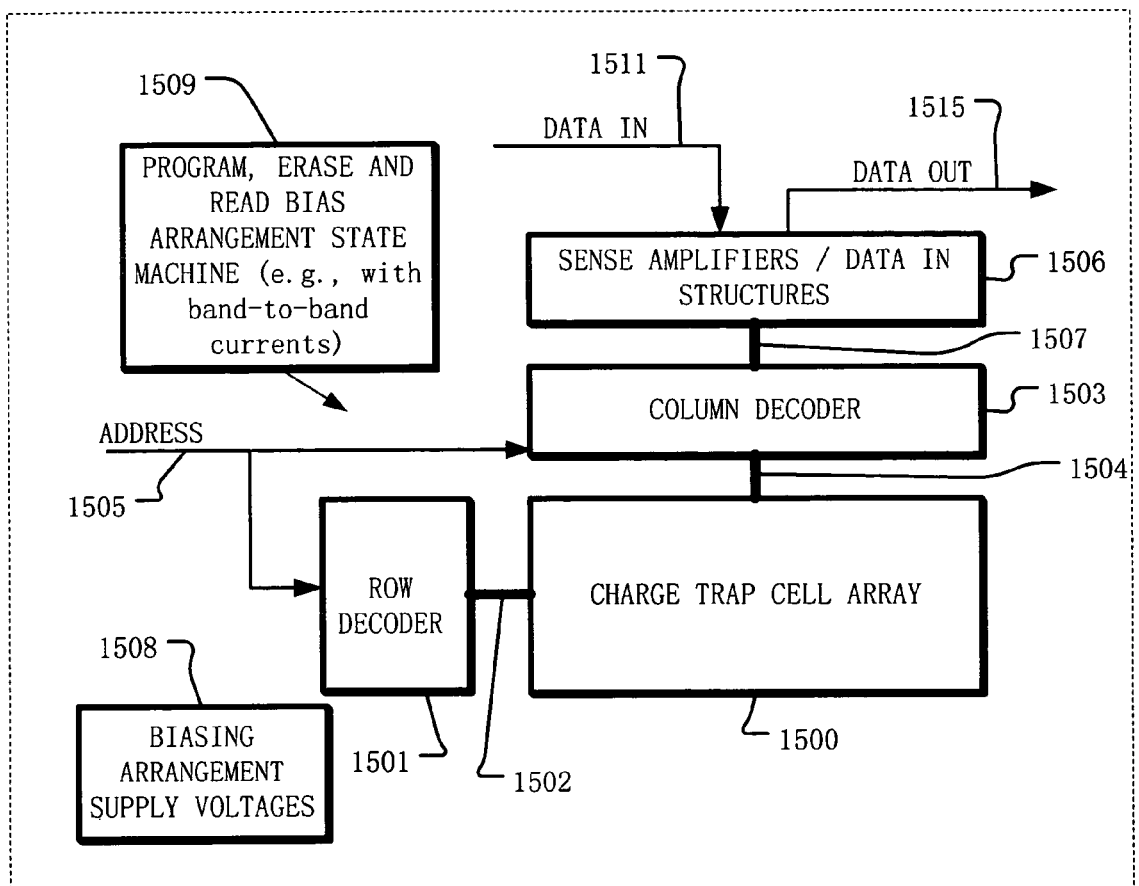
FIG. 15 is a simplified diagram of an integrated circuit with an array of charge trapping memory cells and control circuitry.

FIG. 15 is a simplified block diagram of an integrated circuit according to an embodiment. The integrated circuit 1550 includes a memory array 1500 implemented using charge trapping memory cells, on a semiconductor substrate. A row decoder 1501 is coupled to a plurality of word lines 1502 arranged along rows in the memory array 1500. A column decoder 1503 is coupled to a plurality of bit lines 1504 arranged along columns in the memory array 1500. Addresses are supplied on bus 1505 to column decoder 1503 and row decoder 1501. Sense amplifiers and data-in structures in block 1506 are coupled to the column decoder 1503 via data bus 1507. Data is supplied via the data-in line 1511 from input/output ports on the integrated circuit 1550, or from other data sources internal or external to the integrated circuit 1550, to the data-in structures in block 1506. Data is supplied via the data-out line 1515 from the sense amplifiers in block 1506 to input/output ports on the integrated circuit 1550, or to other data destinations internal or external to the integrated circuit 1550. A bias arrangement state machine 1509 controls the application of bias arrangement supply voltages 1508, such as for the erase verify and program verify voltages, and the arrangements for programming, erasing, and reading the memory cells, such as with the band-to-band currents.

While the present invention is disclosed by reference to the technology and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A nonvolatile memory, comprising:
   a memory array including a plurality of columns, each column of the plurality of columns including a plurality of memory cells arranged in a series having a first end and a second end, each memory cell including:
      a substrate region including source and drain regions;
      a bottom dielectric coupled to the substrate region;
      a charge trapping structure coupled to the bottom dielectric having parts corresponding to the source and drain regions, each of the parts having a charge storage state; and
      a top dielectric coupled to the charge trapping structure; and
   a first pass transistor coupled to the first end of the series;
   a second pass transistor coupled to the second end of the series;
   a bit line coupled to the first pass transistor and the second pass transistor; and
   a plurality of word lines coupled to the top dielectrics of the plurality of memory cells, each word line of the plurality of word lines acting as a gate for memory cells coupled to said each word line; and
   logic coupled to the plurality of memory cells, said logic turning on one of the first pass transistor and the second pass transistor to permit electrical coupling of the bit line to the source region or the drain region of a memory cell of the plurality of memory cells, thereby selecting part of the charge trapping structure corresponding to the source region or the drain region, and said logic applying a first bias arrangement to determine a charge storage state of the selected part of the charge trapping structure.

2. The integrated circuit of claim 1, wherein the first bias arrangement applies a voltage difference between the substrate region and one of the source region or the drain region, and floats the other of the source region or the drain region.

3. The integrated circuit of claim 1, wherein the first bias arrangement causes a first voltage difference between the gate and the one of the source region or the drain region, and a second voltage difference between the substrate region and the one of the source and drain regions, wherein the first voltage difference and the second voltage difference cause sufficient band-to-band tunneling current for said determining, and the first voltage difference and the second voltage differences fail to change the charge storage state.

4. The integrated circuit of claim 1, wherein the first bias arrangement causes a first voltage difference of at least about 5 V between the gate and the one of the source region or the drain region, and a second voltage difference less than about 5 V between the substrate region and the one of the source region or the drain region.

5. The integrated circuit of claim 1, wherein the first bias arrangement induces at least a band-to-band current component through the one of the source region or the drain region.

6. The integrated circuit of claim 1, wherein said first bias arrangement measures current flowing through the substrate region, and the one of the source region or the drain region.

7. The integrated circuit of claim 1, wherein the substrate region is a well in the semiconductor substrate.

8. The integrated circuit of claim 1, wherein said logic further performs:
   applying a second bias arrangement to adjust the charge storage state by increasing a net positive charge in the charge trapping structure; and
   applying a third bias arrangement to adjust the charge storage state by increasing a net negative charge in the charge trapping structure.

9. The integrated circuit of claim 1, wherein said logic further performs:
   applying a second bias arrangement to adjust the charge storage state by increasing a net positive charge in the charge trapping structure via hand-to-band hot hole tunneling; and
   applying a third bias arrangement to adjust the charge storage state by increasing a net negative charge in the charge trapping structure via Fowler-Nordheim tunneling.

10. The integrated circuit of claim 1, wherein said logic further performs:
    applying a second bias arrangement to adjust the charge storage state by increasing a net positive charge in the charge trapping structure via band-to-band hot hole tunneling; and
    applying a third bias arrangement to adjust the charge storage state by increasing a net negative charge in the charge trapping structure via channel hot electron injection current.

11. The integrated circuit of claim 1, wherein said logic further performs:
    applying a second bias arrangement to adjust the charge storage state by increasing a net positive charge in the charge trapping structure via band-to-band hot hole tunneling; and
    applying a third bias arrangement to adjust the charge storage state by increasing a net negative charge in the charge trapping structure via channel initiated secondary electron injection current.

12. The integrated circuit of claim 1, wherein said logic further performs:
    applying a second bias arrangement to adjust the charge storage state by increasing a net positive charge in the charge trapping structure via band-to-band hot hole tunneling; and
    applying a third bias arrangement to adjust the charge storage state by increasing a net negative charge in the charge trapping structure via electron movement between the charge trapping structure and the substrate region.

13. The integrated circuit of claim 1, wherein said logic further performs:
    applying a second bias arrangement to adjust the charge storage state by increasing a net positive charge in the charge trapping structure via band-to-band hot hole tunneling; and
    applying a third bias arrangement to adjust the charge storage state by increasing a net negative charge in the charge trapping structure via electron movement between the charge trapping structure and the gate.

14. The integrated circuit of claim 1, wherein said logic further performs:
applying a second bias arrangement to adjust the charge storage state by increasing a net positive charge in the charge trapping structure; and
applying a third bias arrangement to adjust the charge storage state by increasing a net negative charge in the charge trapping structure,
wherein said first bias arrangement measures current of about 100 nA for the charge storage state adjusted by one of the second bias arrangement and the third bias arrangement, and about 1 nA for the charge storage state adjusted by the other of the second bias arrangement and the third bias arrangement.

15. The integrated circuit of claim 1, wherein said logic further performs:
applying a second bias arrangement to adjust the charge storage state by increasing a net positive charge in the charge trapping structure; and
applying a third bias arrangement to adjust the charge storage state by increasing a net negative charge in the charge trapping structure,
wherein said first bias arrangement measures current at least about 10 times greater for the charge storage state adjusted by one of the second bias arrangement and the third bias arrangement than for the charge storage state adjusted by the other of the second bias arrangement and the third bias arrangement.

16. The integrated circuit of claim 1, wherein the charge storage state of each part of the charge trapping structure stores one bit.

17. The integrated circuit of claim 1, wherein the charge storage state of each part of the charge trapping structure stores multiple bits.

18. The integrated circuit of claim 1, wherein hot holes generated during the first bias arrangement are insufficient to disturb the charge storage state.

19. A method of manufacturing a nonvolatile memory integrated circuit, comprising:
providing a semiconductor substrate;
providing a plurality of memory cells on the substrate arranged in a series having a first end and a second end, each memory cell including:
a substrate region in the semiconductor substrate including source and drain regions;
a bottom dielectric coupled to the substrate region;
a charge trapping structure coupled to the bottom dielectric having parts corresponding to the source and drain regions, each of the parts having a charge storage state; and
a top dielectric coupled to the charge trapping structure; and
providing a first pass transistor coupled to the first end of the series;
providing a second pass transistor coupled to the second end of the series;
providing a bit line coupled to the first pass transistor and the second pass transistor; and
providing a plurality of word lines coupled to the top dielectrics of the plurality of memory cells, each word line of the plurality of word lines acting as a gate for memory cells coupled to said each word line; and
providing logic coupled to the plurality of memory cells, said logic turning on one of the first pass transistor and the second pass transistor to permit electrical coupling of the bit line to the source region or the drain region of a memory cell of the plurality of memory cells, thereby selecting part of the charge trapping structure corresponding to the source region or the drain region, and said logic applying a first bias arrangement to determine a charge storage state of the selected part of the charge trapping structure.

20. The manufacturing method of claim 19, wherein the first bias arrangement applies a voltage difference between the substrate region and one of the source region or the drain region, and floats the other of the source region or the drain region.

21. The manufacturing method of claim 19, wherein the first bias arrangement causes a first voltage difference between the gate and the one of the source region or the drain region, and a second voltage difference between the substrate region and the one of the source and drain regions, wherein the first voltage difference and the second voltage difference cause sufficient band-to-band tunneling current for said determining, and the first voltage difference and the second voltage differences fail to change the charge storage state.

22. The manufacturing method of claim 19, wherein the first bias arrangement causes a first voltage difference of at least about 5 V between the gate and the one of the source region or the drain region, and a second voltage difference less than about 5 V between the substrate region and the one of the source region or the drain region.

23. The manufacturing method of claim 19, wherein the first bias arrangement induces at least a band-to-band current component through the one of source region or the drain region.

24. The manufacturing method of claim 19, wherein said first bias arrangement measures current flowing through the substrate region, and the one of the source region or the drain region.

25. The manufacturing method of claim 19, wherein the substrate region is a well in the semiconductor substrate.

26. The manufacturing method of claim 19, wherein said logic further performs:
applying a second bias arrangement to adjust the charge storage state by increasing a net positive charge in the charge trapping structure; and
applying a third bias arrangement to adjust the charge storage state by increasing a net negative charge in the charge trapping structure.

27. The manufacturing method of claim 19, wherein said logic further performs:
applying a second bias arrangement to adjust the charge storage state by increasing a net positive charge in the charge trapping structure via band-to-band hot hole tunneling; and
applying a third bias arrangement to adjust the charge storage state by increasing a net negative charge in the charge trapping structure via Fowler-Nordheim tunneling.

28. The manufacturing method of claim 19, wherein said logic further performs:
applying a second bias arrangement to adjust the charge storage state by increasing a net positive charge in the charge trapping structure via band-to-band hot hole tunneling; and
applying a third bias arrangement to adjust the charge storage state by increasing a net negative charge in the charge trapping structure via channel hot electron injection current.

29. The manufacturing method of claim 19, wherein said logic further performs:
applying a second bias arrangement to adjust the charge storage state by increasing a net positive charge in the charge trapping structure via band-to-band hot hole tunneling; and
applying a third bias arrangement to adjust the charge storage state by increasing a net negative charge in the charge trapping structure via channel initiated secondary electron injection current.

30. The manufacturing method of claim 19, wherein said logic further performs:
applying a second bias arrangement to adjust the charge storage state by increasing a net positive charge in the charge trapping structure via band-to-band hot hole tunneling; and
applying a third bias arrangement to adjust the charge storage state by increasing a net negative charge in the charge trapping structure via electron movement between the charge trapping structure and the substrate region.

31. The manufacturing method of claim 19, wherein said logic further performs:
applying a second bias arrangement to adjust the charge storage state by increasing a net positive charge in the charge trapping structure via band-to-band hot hole tunneling; and
applying a third bias arrangement to adjust the charge storage state by increasing a net negative charge in the charge trapping structure via electron movement between the charge trapping structure and the gate.

32. The manufacturing method of claim 19, wherein said logic further performs:
applying a second bias arrangement to adjust the charge storage state by increasing a net positive charge in the charge trapping structure; and
applying a third bias arrangement to adjust the charge storage state by increasing a net negative charge in the charge trapping structure,
wherein said first bias arrangement measures current of about 100 nA for the charge storage state adjusted by one of the second bias arrangement and the third bias arrangement, and about 1 nA for the charge storage state adjusted by the other of the second bias arrangement and the third bias arrangement.

33. The manufacturing method of claim 19, wherein said logic further performs:
applying a second bias arrangement to adjust the charge storage state by increasing a net positive charge in the charge trapping structure; and
applying a third bias arrangement to adjust the charge storage state by increasing a net negative charge in the charge trapping structure,
wherein said first bias arrangement measures current at least about 10 times greater for the charge storage state adjusted by one of the second bias arrangement and the third bias arrangement than for the charge storage state adjusted by the other of the second bias arrangement and the third bias arrangement.

34. The manufacturing method of claim 19, wherein the charge storage state of each part of the charge trapping structure stores one bit.

35. The manufacturing method of claim 19, wherein the charge storage state of each part of the charge trapping structure stores multiple bits.

36. The manufacturing method of claim 19, wherein hot holes generated during the first bias arrangement are insufficient to disturb the charge storage state.

* * * * *